(12) United States Patent  
Yamauchi

(10) Patent No.: US 7,562,256 B2  
(45) Date of Patent: Jul. 14, 2009

(54) SEMICONDUCTOR MEMORY DEVICE FOR BUILD-IN FAULT DIAGNOSIS

(75) Inventor: Hisashi Yamauchi, Kanagawa (JP)

(73) Assignee: Nec Electronics Corporation, Kawasaki, Kanagawa (JP)

( * ) Notice: Subject to any disclaimer, the term of this patent is extended or adjusted under 35 U.S.C. 154(b) by 573 days.

(21) Appl. No.: 11/131,229

(22) Filed: May 18, 2005

(65) Prior Publication Data

US 2005/0262422 A1    Nov. 24, 2005

(30) Foreign Application Priority Data

May 20, 2004    (JP)    ............................. 2004-150293

(51) Int. Cl.  
    *G06F 11/00*    (2006.01)
(52) U.S. Cl. .......................... 714/42; 714/718; 714/723
(58) Field of Classification Search ................... 714/42, 714/718, 723  
See application file for complete search history.

(56) References Cited

U.S. PATENT DOCUMENTS

| | | | | | |
|---|---|---|---|---|---|
| 4,775,954 | A | * | 10/1988 | Fujieda et al. | 713/502 |
| 4,817,093 | A | * | 3/1989 | Jacobs et al. | 714/728 |
| 4,871,956 | A | * | 10/1989 | Barrella | 320/135 |
| 5,200,959 | A | * | 4/1993 | Gross et al. | 714/723 |
| 5,226,150 | A | * | 7/1993 | Callander et al. | 714/57 |
| 5,268,869 | A | * | 12/1993 | Ferris et al. | 365/205 |
| 5,588,115 | A | * | 12/1996 | Augarten | 714/29 |
| 5,621,883 | A | * | 4/1997 | Thoulon et al. | 714/9 |
| 5,644,704 | A | * | 7/1997 | Pease et al. | 714/42 |
| 5,774,646 | A | * | 6/1998 | Pezzini et al. | 714/42 |
| 5,917,833 | A | * | 6/1999 | Sato | 714/718 |
| 5,938,774 | A | * | 8/1999 | Hsu | 714/6 |
| 6,014,033 | A | * | 1/2000 | Fitzgerald et al. | 324/765 |
| 6,029,260 | A | * | 2/2000 | Hashizume et al. | 714/723 |
| 6,137,734 | A | * | 10/2000 | Schoner et al. | 365/194 |
| 6,253,333 | B1 | * | 6/2001 | Bogumil et al. | 713/503 |
| 6,347,056 | B1 | * | 2/2002 | Ledford et al. | 365/201 |
| 6,459,635 | B1 | * | 10/2002 | Mullarkey et al. | 365/201 |
| 6,535,986 | B1 | * | 3/2003 | Rosno et al. | 713/400 |
| 6,536,005 | B1 | * | 3/2003 | Augarten | 714/723 |
| 6,550,023 | B1 | * | 4/2003 | Brauch et al. | 714/42 |
| 6,574,763 | B1 | * | 6/2003 | Bertin et al. | 714/738 |
| 6,604,060 | B1 | * | 8/2003 | Ryan et al. | 702/186 |

(Continued)

FOREIGN PATENT DOCUMENTS

JP        11-16392        1/1999

(Continued)

*Primary Examiner*—Robert Beausoliel  
*Assistant Examiner*—Joshua P Lottich  
(74) *Attorney, Agent, or Firm*—McGinn IP Law Group, PLLC

(57) ABSTRACT

A fault diagnosis method for a semiconductor device in which a memory and a register are monolithically integrated is provided. The fault diagnosis method is composed of: first testing the memory with respect to a series of addresses to identify a first error address; externally outputting the first error address; storing the first error address into the register; second testing the memory with respect to a series of addresses; identifying a second error address different from the first error address using a result of the second testing and the first error address stored in the register; externally outputting the second error address; and updating the register to store the second error address.

20 Claims, 10 Drawing Sheets

U.S. PATENT DOCUMENTS

| | | | |
|---|---|---|---|
| 6,625,766 B1 * | 9/2003 | Oh et al. | 714/719 |
| 6,643,807 B1 * | 11/2003 | Heaslip et al. | 714/719 |
| 6,691,264 B2 * | 2/2004 | Huang | 714/723 |
| 6,711,705 B1 * | 3/2004 | Yasui | 714/723 |
| 6,721,216 B2 * | 4/2004 | Mak et al. | 365/201 |
| 6,760,865 B2 * | 7/2004 | Ledford et al. | 714/30 |
| 6,781,901 B2 * | 8/2004 | Shore | 365/201 |
| 6,826,720 B2 * | 11/2004 | Suzuki et al. | 714/720 |
| 6,829,737 B1 * | 12/2004 | McBride | 714/718 |
| 6,851,078 B2 * | 2/2005 | Takano | 714/718 |
| 6,895,538 B2 * | 5/2005 | Benedix et al. | 714/723 |
| 6,901,542 B2 * | 5/2005 | Bartenstein et al. | 714/719 |
| 6,904,551 B1 * | 6/2005 | Davidson | 714/718 |
| 6,910,155 B2 * | 6/2005 | Ku | 714/30 |
| 6,959,256 B2 * | 10/2005 | Basto | 702/117 |
| 6,968,479 B2 * | 11/2005 | Wyatt et al. | 714/53 |
| 7,062,695 B2 * | 6/2006 | Tester | 714/733 |
| 7,093,176 B2 * | 8/2006 | Nicolaidis et al. | 714/733 |
| 7,096,393 B2 * | 8/2006 | Caty et al. | 714/718 |
| 7,107,501 B2 * | 9/2006 | Ohlhoff et al. | 714/723 |
| 7,113,015 B2 * | 9/2006 | Hauptner et al. | 327/276 |
| 7,124,336 B2 * | 10/2006 | Adler et al. | 714/723 |
| 7,143,321 B1 * | 11/2006 | Everett et al. | 714/718 |
| 7,155,643 B2 * | 12/2006 | Ichikawa | 714/710 |
| 7,194,667 B2 * | 3/2007 | McBride | 714/718 |
| 7,197,670 B2 * | 3/2007 | Boatright et al. | 714/42 |
| 7,210,085 B2 * | 4/2007 | Brennan et al. | 714/733 |
| 7,225,372 B2 * | 5/2007 | Suzuki et al. | 714/720 |
| 7,240,256 B2 * | 7/2007 | Yamane | 714/723 |
| 7,296,198 B2 * | 11/2007 | Kaiser et al. | 714/723 |
| 7,313,739 B2 * | 12/2007 | Menon et al. | 714/718 |
| 7,320,100 B2 * | 1/2008 | Dixon et al. | 714/758 |
| 7,325,178 B2 * | 1/2008 | Damodaran et al. | 714/718 |
| 7,337,381 B2 * | 2/2008 | Fujisaki | 714/738 |
| 7,370,237 B2 * | 5/2008 | Kim et al. | 714/30 |
| 2002/0066056 A1 * | 5/2002 | Suzuki et al. | 714/720 |
| 2002/0141276 A1 * | 10/2002 | Mak et al. | 365/230.06 |
| 2002/0157049 A1 * | 10/2002 | Kaiser et al. | 714/723 |
| 2003/0167431 A1 * | 9/2003 | Nicolaidis et al. | 714/733 |
| 2003/0206474 A1 * | 11/2003 | Shore | 365/208 |
| 2004/0216006 A1 * | 10/2004 | Kim et al. | 714/30 |
| 2005/0044458 A1 * | 2/2005 | Suzuki et al. | 714/718 |
| 2005/0138496 A1 * | 6/2005 | Brennan et al. | 714/718 |
| 2006/0156136 A1 * | 7/2006 | McBride | 714/736 |
| 2007/0198880 A1 * | 8/2007 | Takazawa et al. | 714/718 |

FOREIGN PATENT DOCUMENTS

| | | |
|---|---|---|
| JP | 11-16393 | 1/1999 |
| JP | 2000-276898 | 10/2000 |

\* cited by examiner

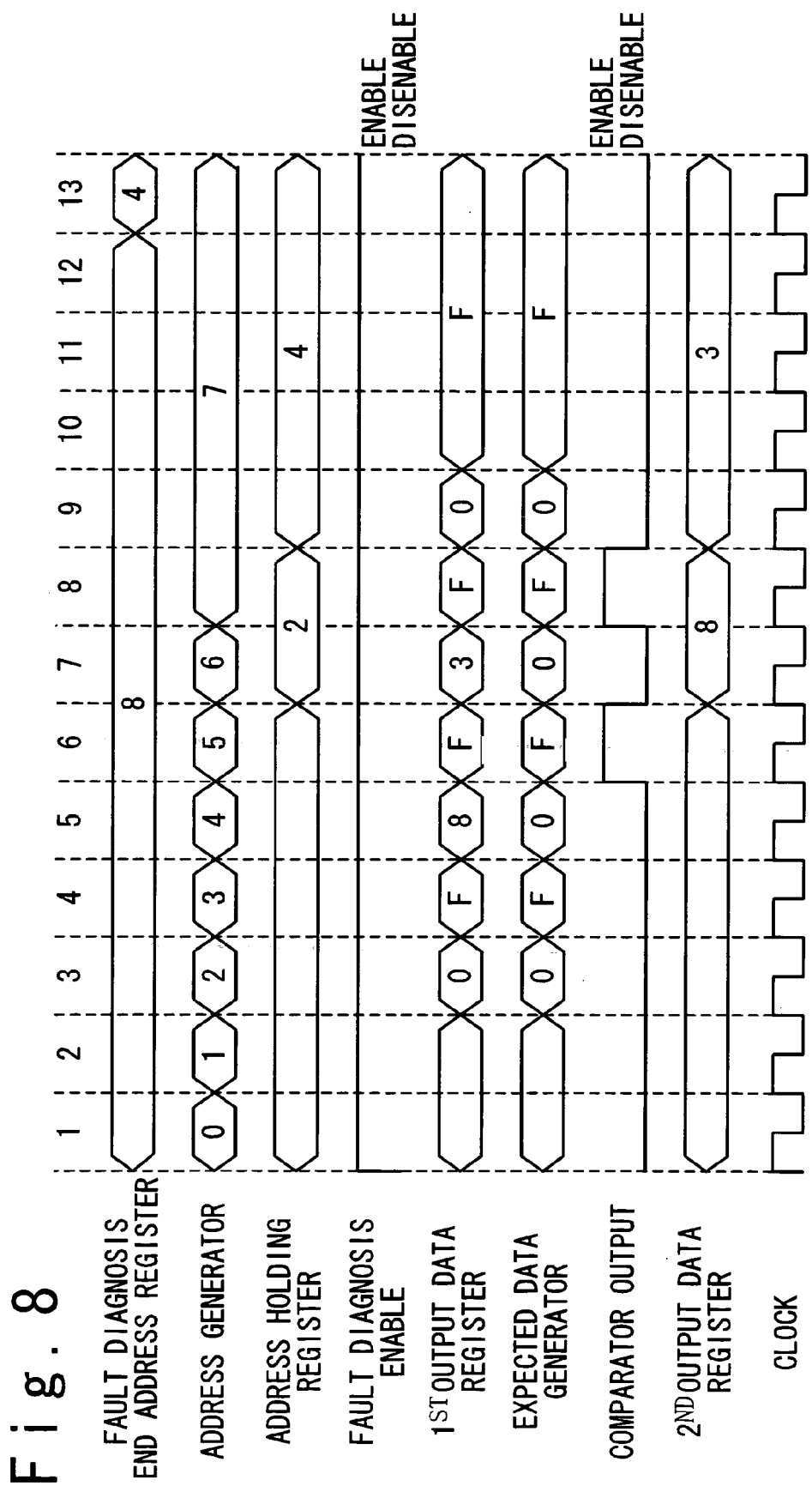

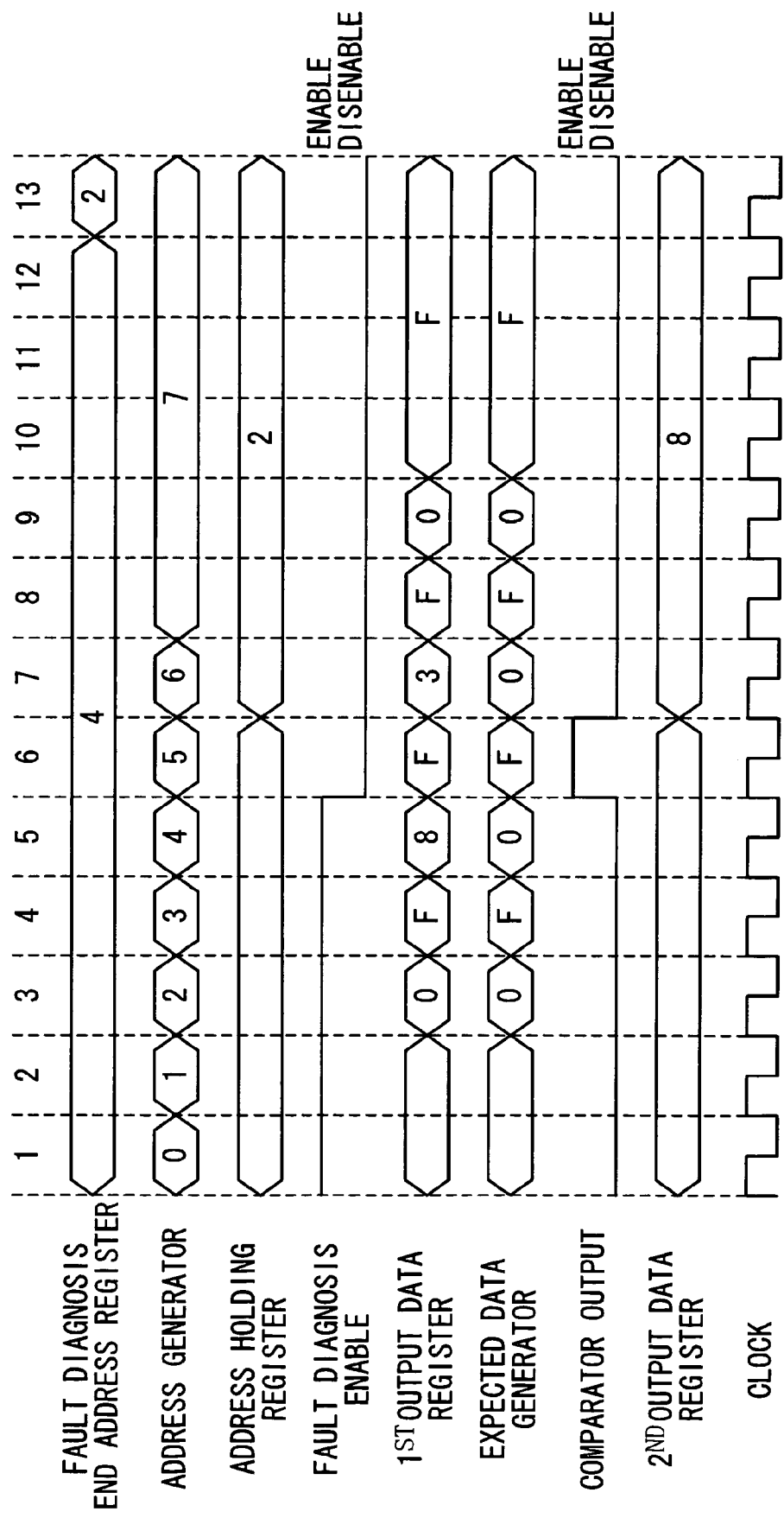

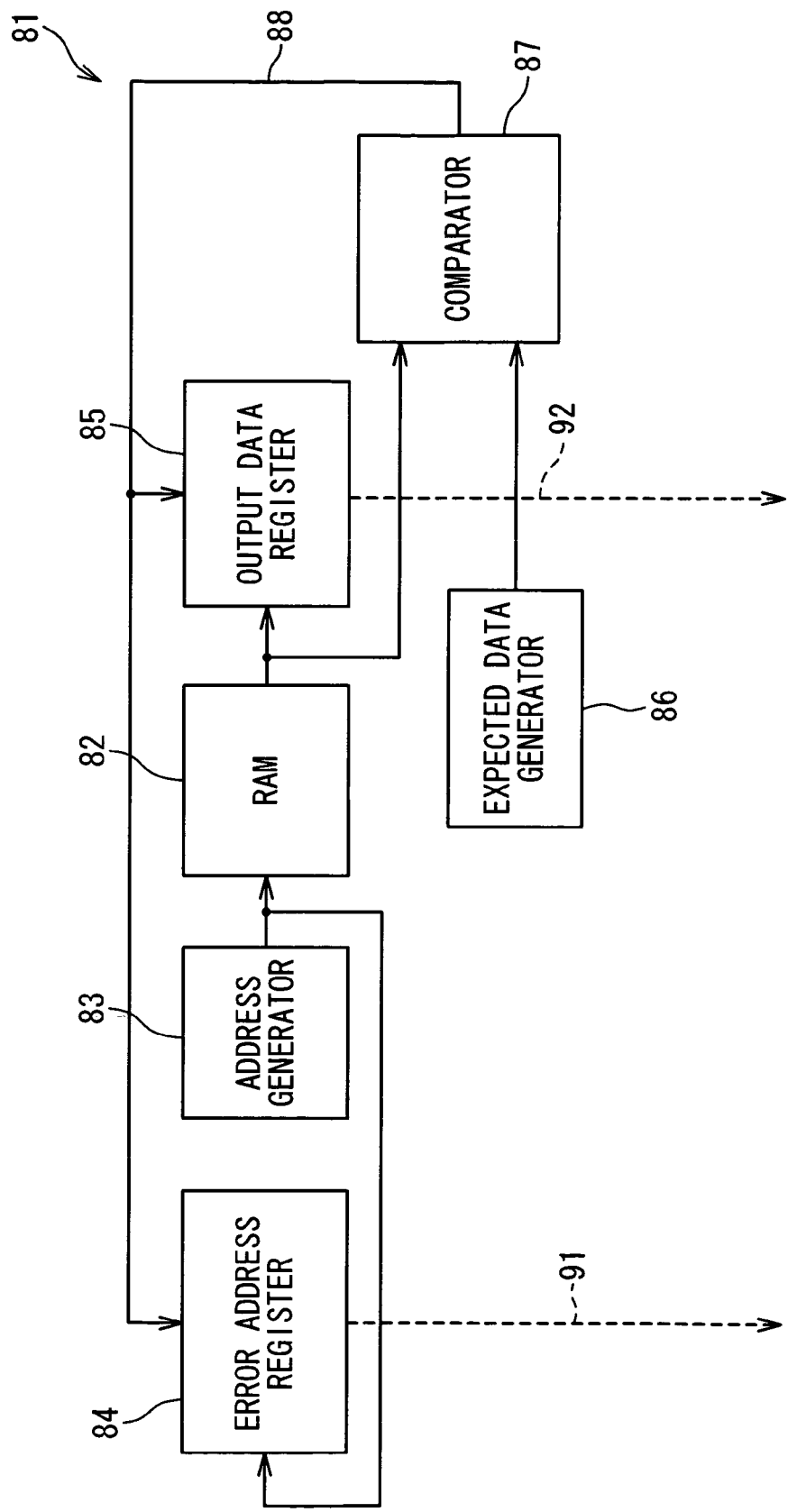

SEMICONDUCTOR MEMORY DEVICE FOR BUILD-IN FAULT DIAGNOSIS

BACKGROUND OF THE INVENTION

1. Field of the Invention

The present invention relates to on-chip fault diagnosis of semiconductor memory devices, such as built-in self test (BIST) techniques.

2. Description of the Related Art

The BIST architecture, in which a memory device is designed to test itself, is well-known in the art. As disclosed in Japanese Laid Open Patent Application JP-A 2000-276898, one requirement on the BIST architecture is to identify error addresses and to identify data read from the error addresses. Information on the error addresses and the data read from the error addresses provides an important basis for analyzing the cause of fault of the memory device.

One issue of the BIST architecture is that storing all the error addresses within the memory device to be tested requires an increased circuitry overhead. As disclosed in Japanese Laid Open Patent Application No. JP-A-Heisei 11-16392, an approach for reducing the circuitry overhead is to externally output the error address each time an error is found.

FIG. 1 is a structure of a memory device adopting such BIST architecture. A memory device is composed of a fault diagnosis circuit 100 and an RAM 102, which are monolithically integrated within a single semiconductor chip. The fault diagnosis circuit 100 is designed to perform on-chip test of the RAM 102. The RAM 102 is composed of a plurality of addressable memory cells. When a write request is issued, the RAM 102 receives and stores externally-inputted data onto a memory cell associated with the write address. When a read request is issued, the RAM 102 outputs data stored in a memory cell selected by the read address.

The fault diagnosis circuit 100 includes an address generator 103, an expected data generator 104, a comparator 105, and a test result register 106.

The address generator 103 generates and updates the test address of the RAM 102. The update of the address is synchronous with a clock; the address generator 103 increases the test address for each clock cycle. The address generator 103 is designed to stop updating the test address when being instructed by a control signal 107 received from the comparator 105. The address generator 103 is typically composed of a counter.

The expected data generator 104 develops expected data for each address to be tested.

The comparator 105 compares data received from the RAM 102 with the expected data received from the expected data generator 104. When the data received from the RAM 102 matches the expected data, the comparator 105 activates the control signal 107 to indicate the address generator 103 to stop generating the address.

The test result register 106 is designed to store the comparison result between the data received from the RAM 102 and the expected data. The test result register 106 is designed to be externally accessible through a signal line 108. The test result register 106 externally outputs the comparison result through the signal line 108.

The fault diagnosis circuit 100 is designed perform test on each address of the RAM 102. When no error is found on a specific test address, the fault diagnosis circuit 100 updates the test address to the next address. When an error is found, the fault diagnosis circuit 100 stops updating the test address.

One drawback of this test procedure is that a speed dependent error may be overlooked. The aforementioned test procedure interrupts the test at a certain address when an error is found, and the subsequent test is resumed from the address at which the test is interrupted. This results in that the test address is not updated at constant time intervals, and the RAM 102 is partially tested at a reduced frequency. Testing the RAM 102 at a reduced frequency may undesirably lead to an overlook of a speed dependent error.

Another drawback of the above-described test procedure is that a considerably long duration is necessary for transferring the test result from the memory device to an external tester. When the tested RAM 102 is a DRAM, the duration required to extract the test result may exceed the refresh cycle. This undesirably results in that a normal address may be incorrectly detected as an error address.

Therefore, there is a need for providing on-chip fault diagnosis architecture which allows detection of speed dependent error within memory devices with a small circuitry overhead.

Japanese Laid Open Patent Application JP-A-Heisei 11-16393 discloses a self test circuit designed to output fail bit map information within a reduced time duration. The self test circuit is composed of an error address detector for detecting an error address, and a data compression device for compressing error address information. The compressed error is externally outputted to an external tester.

SUMMARY OF THE INVENTION

In an aspect of the present invention, a fault diagnosis method for a semiconductor device in which a memory and a register are monolithically integrated is composed of:

first testing said memory with respect to a series of addresses to identify a first error address;

externally outputting said first error address;

storing said first error address into said register;

second testing said memory with respect to a series of addresses;

identifying a second error address different from said first error address using a result of said second testing and said first error address stored in said register; externally outputting said second error address; and updating said register to store said second error address.

The fault diagnosis method thus designed effectively reduces the circuit overhead for storing error addresses, while achieving detection of speed-dependent errors.

In one preferred embodiment, the second testing involves successively testing the memory from a predetermined start address to a certain address higher than the first error address, and an error address which is firstly found by the second testing in an address range higher than the first error address is identified as the second error address.

In another preferred embodiment, the first testing involves successively testing the memory from a start address to an end address, and an error address which is finally found by the first testing is identified as being the first error address. The second testing involves successively testing the memory from the start address to a just previous address of the first error address or to a certain address higher than the first error address, and an error address which is finally found by the second testing in an address range from the start address to the just previous address is identified as the second error address.

In another aspect of the present invention, a semiconductor device is composed of a memory; an address generator generating and updating an address so that the address is successively increased from a certain start address; a fault diagnosis start address register containing a fault diagnosis start address so that the fault diagnosis start address is externally accessible; a fault diagnosis enable generator comparing the address with the fault diagnosis start address; and a comparator comparing output data obtained from the address of the memory with an expected value associated with the address. The address generator is designed to stop updating the address when the output data does not match the expected value, and the address is higher than the fault diagnosis start address. The fault diagnosis start address register is designed to receive a stop address at which the update of the address is stopped, and to update the fault diagnosis start address to the stop address.

In still another aspect of the present invention, a semiconductor device is composed of a memory; an address generator generating and updating an address so that the address is successively increased from a certain start address; a fault diagnosis end address register containing a fault diagnosis end address so that the fault diagnosis end address is externally accessible; an address holding register designed to receive the address from the address generator; a fault diagnosis enable generator comparing the address with the fault diagnosis end address; and a comparator comparing output data obtained from the address of the memory with an expected value associated with the address. The address holding register is updated to store the address received from the address generator when the address is lower than the fault diagnosis end address, and the output data does not match the expected data. The fault diagnosis end address contained in the fault diagnosis end address register is updated to the address contained in the address holding register after the address reaches a just previous address of the fault diagnosis end address.

In still another aspect of the present invention, a semiconductor device is composed of a memory; an address generator generating and updating an address so that the address is successively increased from a certain start address; an error address holding register designed to receive the address from the address generator; and a comparator comparing output data obtained from the address of the memory with an expected value associated with the address. The error address holding register is updated to store the address received from the address generator when the output data does not match the expected data. The error address holding register is externally accessible.

BRIEF DESCRIPTION OF THE DRAWINGS

The above and other advantages and features of the present invention will be more apparent from the following description taken in conjunction with the accompanied drawings, in which:

FIG. 8 is a timing chart showing operations of the fault diagnosis circuit shown in FIG. 7 during the first test;

FIG. 9 is a timing chart showing operations of the fault diagnosis circuit shown in FIG. 7 during the second test; and FIG. 10 is a block diagram showing an exemplary structure of the fault diagnosis circuit in still another embodiment of the present invention.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

First and Second Embodiments

Figure 1:
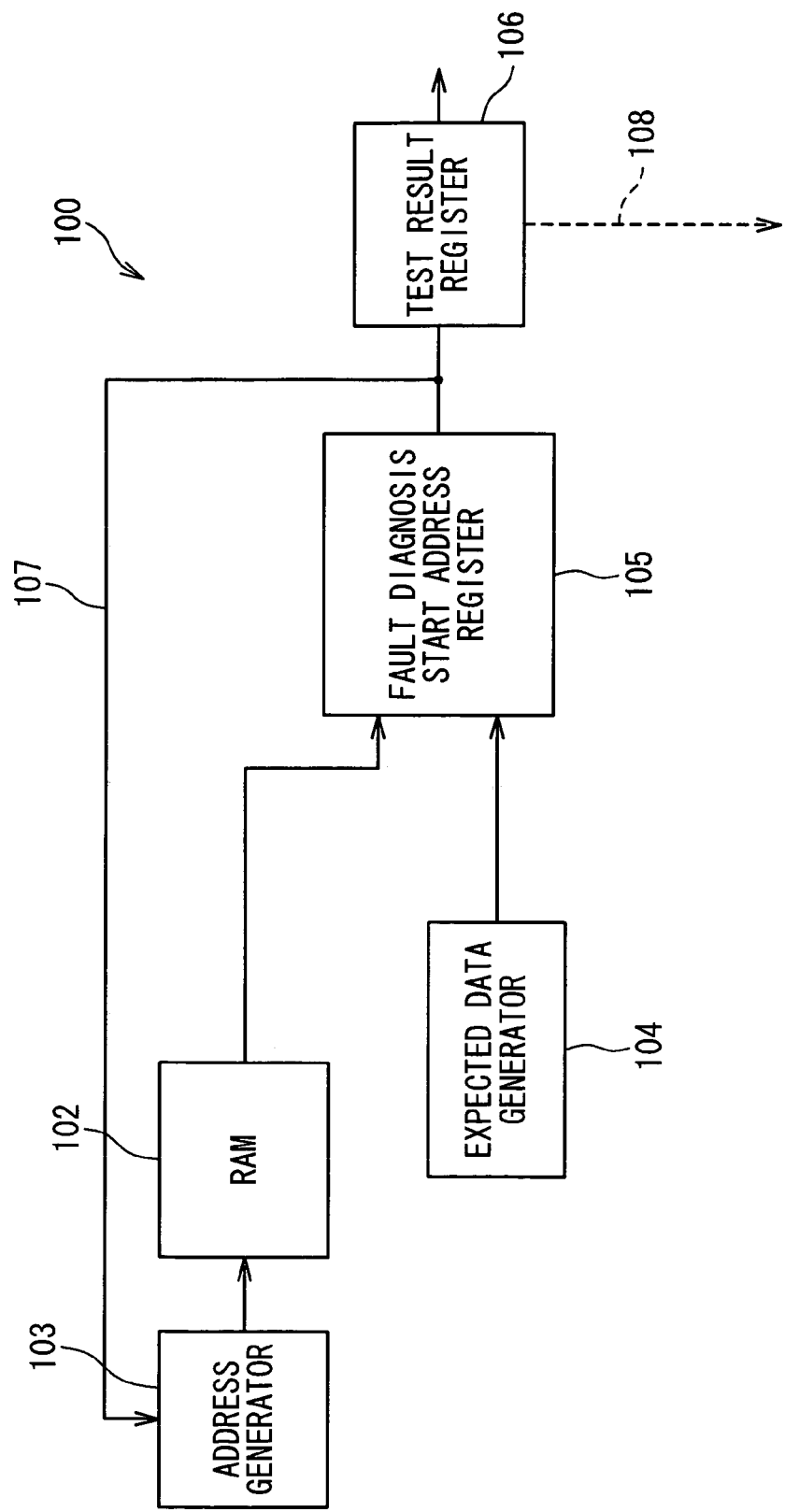
FIG. 1 is a block diagram showing an exemplary structure of a conventional fault diagnosis circuit.
Figure 2:
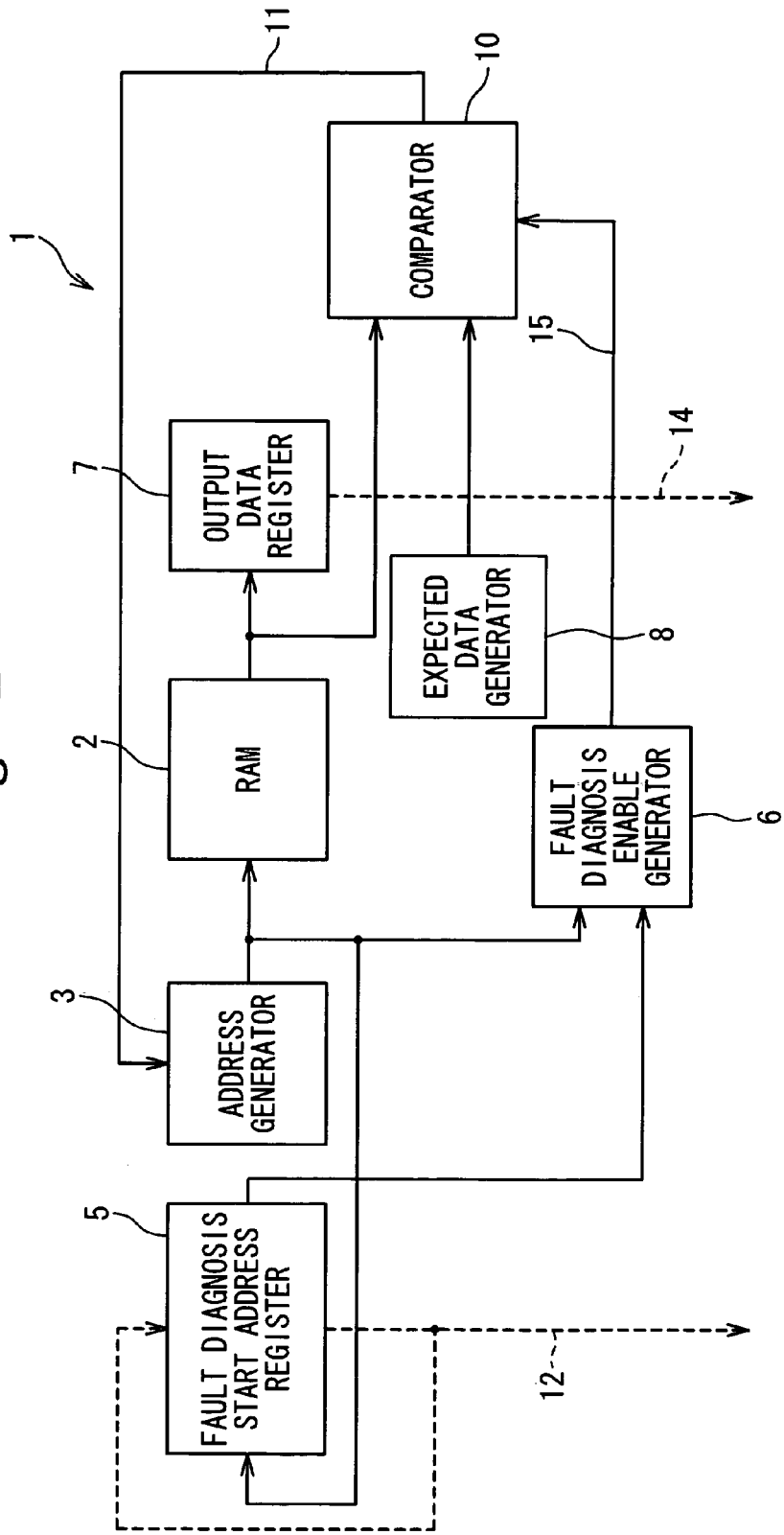
FIG. 2 is a block diagram showing an exemplary structure of a fault diagnosis circuit in one embodiment of the present invention.

In a first embodiment, as shown in FIG. 2, a fault diagnosis circuit 1 and an RAM 2 are monolithically integrated within a single semiconductor chip. The fault diagnosis circuit 1 is designed to test the RAM 2. The RAM 2 includes a plurality of memory cells identified by associated addresses. For simplicity, it is assumed in this embodiment that the address of the RAM 2 ranges from 0 to 7, represented by four bits. When a write address and a write data are externally inputted during a write operation, the RAM 2 stores the write data in the memory cell associated with the write address. When a read address is inputted during a read operation, the RAM 2 outputs the data stored in the memory cell associated with the read address.

The fault diagnosis circuit 1 includes an address generator 3, a fault diagnosis start address register 5, a fault diagnosis enable generator 6, an output data register 7, an expected data generator 8, and a comparator 10.

The address generator 3 generates and updates the test address for the RAM 2. The address generator 3 is responsive to an address update enable signal 11 received from the comparator 10 for updating the test address; the address generator 3 updates the test address while the address update enable signal 11 is enabled. The update of the test address is synchronous with a clock signal; the address generator 3 increases the test address for each clock cycle. The address generator 3 is designed to stop updating the test address in response to the address update enable signal 11 being disabled. The address generator 3 is typically composed of a counter.

The fault diagnosis start address register 5 is designed to latch the test address received from the address generator 3. The fault diagnosis start address register 5 is externally accessible through a signal line 12. The signal line 12 provides a feed back loop from the shift output to the shift input for the fault diagnosis start address register 5. This allows the fault diagnosis start address register 5 to retain the address after the stored address is shifted out, and eliminates the need for restoring the outputted address into the fault diagnosis start address register 5.

The fault diagnosis enable generator 6 is responsive to the test address received from the address generator 3, for providing a diagnosis enable signal 15 for the comparator 10. When the test address is equal to or lower than the address received from the fault diagnosis start address register 5, the diagnosis enable signal 15 is disenabled. When the test address is higher than the address received from the fault diagnosis start address register 5, the diagnosis enable signal 15 is enabled.

The output data register 7 stores output data received from the RAM 2. The output data register 7 is designed to be externally accessible through a signal line 14, connected to the outside world.

The expected data generator 8 develops expected data for each test address. The expected data is provided for the comparator 10.

The comparator 10 is responsive to the diagnosis enable signal 15 for comparing the output data received from the RAM 2 with the expected data received from the expected data generator 8. When the diagnosis enable signal 15 is enabled and the output data received from the RAM 2 does not match with the expected data received from the expected data generator e, the comparator 10 disenables the address update enable signal 11 for indicating the address generator 3 to stop updating the test address. When the diagnosis enable signal 15 is disenabled, or when the output data received from the RAM 2 matches the expected data received from the expected data generator 8, the comparator 10 enables the address update enable signal 11.

The fault diagnosis method, involving testing the RAM 2 using the fault diagnosis circuit 1, is composed of the following steps: a test data write step, a first test step, and one or more subsequent test steps following the first test step.

The test data write step involves writing test data onto the RAM 2. In this embodiment, data of "0" is written each even-numbered address of the RAM 2, and data of "F" (or data of "15" in the decimal notation) is written to each odd-numbered address.

The test data write step is followed by the first test step. The first test step begins with initializing the fault diagnosis start address register 5; the fault diagnosis start address register 5 is set to a certain address indicating the first test step. The first test is then initiated from a start address, continuously supplying the clock signal to the fault diagnosis circuit 1 and the RAM 2. During the first test, the address contained in the fault diagnosis start address register 5 is inputted to the fault diagnosis enable generator 6. After the supply of the clock signal over clock cycles sufficient to test all of the addresses of the RAM 2, the test address developed on the output of the address generator 3 is written to the fault diagnosis start address register 5. When there are one or more errors in the RAM 2, this results in that the fault diagnosis start address register 5 is set to the lowest error address, and that the output data register 7 holds the data obtained from the lowest error address, since the address generator 3 stops updating the test address. The error address is then externally outputted from the fault diagnosis start address register 5, and the data obtained from the error address is externally outputted from the output data register 7.

One or more subsequent tests are performed after the first test when any error is found during the first test. At the beginning of the second test, the fault diagnosis start address register 5 contains the lowest error address. The second test is then performed, continuously supplying the clock signal to the fault diagnosis circuit 1 and the RAM 2. It should be noted that the second test is started from the same start address as the first test, not from the next address of the lowest error address. This is important for detecting speed-dependent errors within the RAM 2. After supplying the clock signal over clock cycles sufficient to test all of the addresses of the RAM 2, the test address developed on the output of the address generator 3, which is the second lowest error address if one or more other errors exist, is written to the fault diagnosis start address register 5. The second lowest error address is then externally outputted from the fault diagnosis start address register 5, and the data obtained from the second lowest error address is externally outputted from the output data register 7. The thus-described test is repeated till no additional error is found during the test.

It should be noted that the diagnosis enable signal 15 is enabled during the subsequent test(s), which is performed from the start address after the first test, only when the test address is higher than the address stored in the fault diagnosis start address register 5. When an error is found at an address #2 during the first test, for example, the address #2 is stored in the fault diagnosis start address register 5, and the diagnosis enable signal 15 is enabled to activate the comparator 10 during the second test, when the test address is equal to or higher than the address #3. The address update enable signal 11 is disenabled to stop the update of the test address when another error is found at the address #3 or higher. This achieves the identification of the second lowest error address. The same goes for all of the remaining error address(es); the third test, for example, achieves the identification of the third lowest error address. The fault diagnosis method thus-described effectively reduces hardware for storing error addresses; the fault diagnosis circuit 1 is required to store only one error address for externally obtaining all the error addresses.

Figure 3:
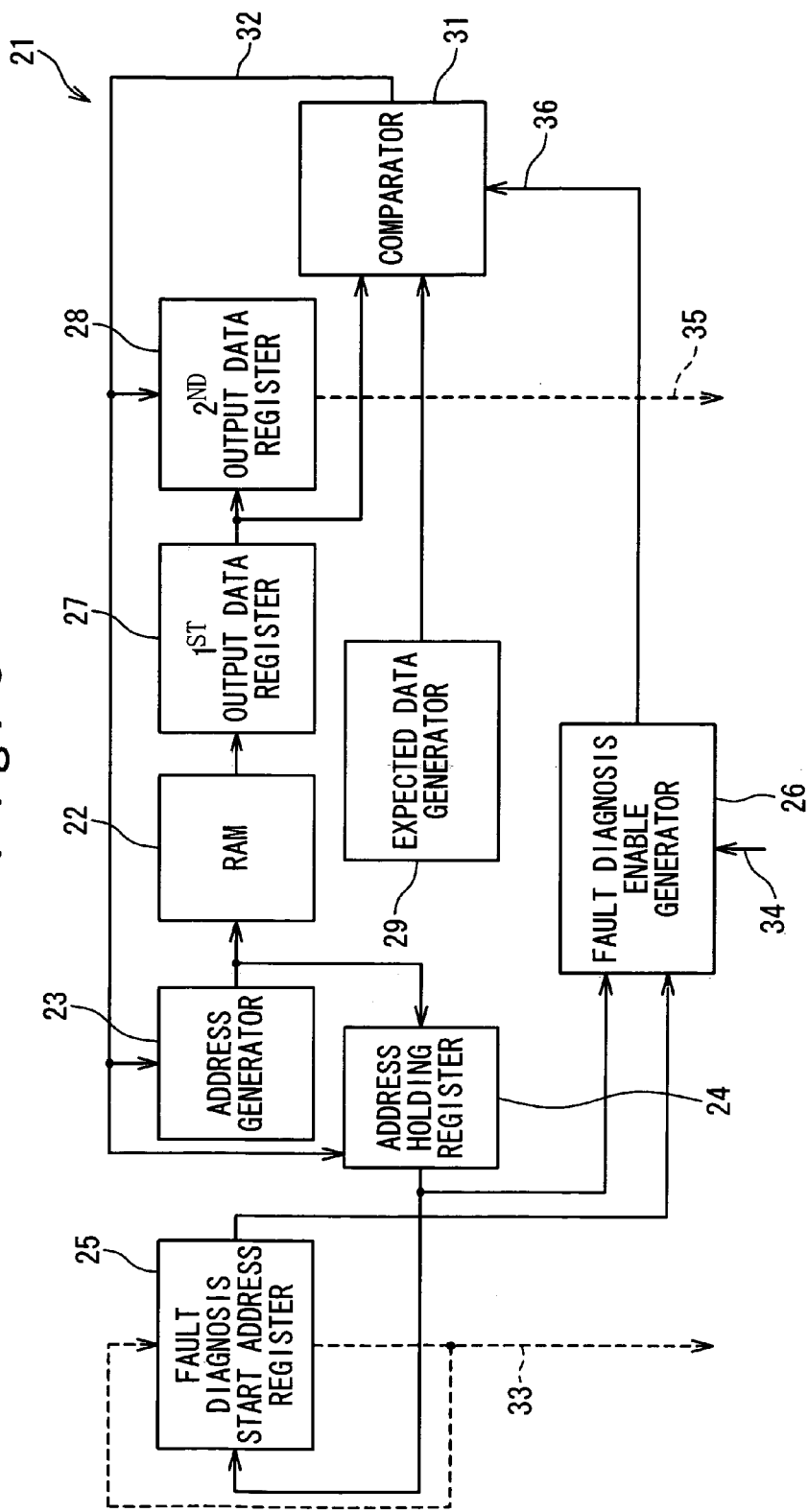
FIG. 3 is a block diagram showing an exemplary structure of a fault diagnosis circuit in another embodiment of the present invention.

FIG. 3 is a block diagram showing an exemplary structure of the fault diagnosis circuit in a second embodiment of the present invention. A fault diagnosis circuit 21 and an RAM 22 are monolithically integrated within a single semiconductor chip. The fault diagnosis circuit 21 is designed to test the RAM 22. The RAM 22 includes a plurality of memory cells identified by associated addresses. For simplicity, it is assumed that the address of the RAM 22 ranges from 0 to 7, represented by four bits. When a write address and a write data are externally inputted during a write operation, the RAM 22 stores the write data in the memory cell associated with the write address. When a read address is inputted during a read operation, the RAM 22 outputs the data stored in the memory cell associated with the read address.

The structure of the fault diagnosis circuit 21 is similar to that of the fault diagnosis circuit 1 shown in FIG. 2, in exception that the fault diagnosis circuit 21 is adapted to the fact that an synchronous DRAM is used as the RAM 22; the RAM 22 exhibits data read latency, outputting data stored in a selected memory cell one or more clock cycles after receiving the address associated with the selected memory cell.

Specifically, the fault diagnosis circuit 21 includes an address generator 23, an address holding register 24, a fault diagnosis start address register 25, a fault diagnosis enable generator 26, a set of first and second output data registers 27 and 28, an expected data generator 29, and a comparator 31, The difference from the fault diagnosis circuit 1 shown in FIG. 2 is that the address holding register 24 and a pair of serially-connected output data registers are additionally incorporated within the fault diagnosis circuit 21.

The address generator 23 generates and updates the test address for the RAM 22. The address generator 23 is responsive to an address update enable signal 32 received from the comparator 31 for updating the test address; the address generator 23 updates the test address while the address update enable signal 32 is enabled. The update of the test address is synchronous with a clock signal; the address generator 23 increases the test address for each clock cycle. The address generator 23 is designed to stop updating the test address in response to the address update enable signal 32 being disabled. The address generator 23 is typically composed of a counter.

The address holding register 24 is composed of a three-stage shift register designed to hold the test addresses received from the address generator 23 for three clock cycles. The first stage (or the input stage) of the address holding register 24 receives the test address from the address generator 23, and the received test address is then transferred to the second and third stages. The output of the second stage (or the middle stage) the address holding register 24 is connected to the fault diagnosis enable generator 26, and the output of the third stage (or the output stage) is connected to the fault diagnosis start address register 25. The address holding register 24 is responsive to the address update enable signal 32 to latch the test address from the address generator 23.

The fault diagnosis start address register 25 is designed to latch the test address received from the address holding register 24. The fault diagnosis start address register 25 is externally accessible through a signal line 33. The signal line 33 provides a feed back loop from the shift output to the shift input for the fault diagnosis start address register 25. This allows the fault diagnosis start address register 25 to retain the address after the stored address is shifted out, and eliminates the need for restoring the outputted address into the fault diagnosis start address register 25.

The fault diagnosis enable generator 26 is responsive to a first test indication signal 34 externally inputted, which indicates whether the current test is the first test or not, for providing the comparator 31 with a diagnosis enable signal 36 in response to the test address received from the address holding register 24. When the first test indication signal 34 is activated to indicate that the current test is the first test, the fault diagnosis enable generator 26 unconditionally enables the diagnosis enable signal 36. When the first test indication signal 34 is deactivated, on the other hand, the fault diagnosis enable generator 26 compares the address received from the address holding register 24 with the address received from the fault diagnosis start address register 25. When the address received from the address holding register 24 is equal to or lower than the address received from the fault diagnosis start address register 25 with the first test indication signal 34 deactivated, the fault diagnosis enable generator 26 disenables the diagnosis enable signal 36 to deactivate the comparator 31. When the address received from the address holding register 24 is higher than the address received from the fault diagnosis start address register 25 with the first test indication signal 34 deactivated, on the other hand, the fault diagnosis enable generator 26 enables the diagnosis enable signal 36 to activate the comparator 31.

The first output data register 27 is designed to latch output data received from the RAM 22, and to contain the latched data for one clock cycle. The output of the first output data register 27 is connected to the second output data register 28 and the comparator 31.

The second output data register 28 is responsive to the address update enable signal 32 to latch the output data from the first output data register 27. When the address update enable signal 32 is enabled, the second output data register 28 latches the output data in synchronization with the clock signal. When the address update enable signal 32 is disenabled, the second output data register 28 retains the data stored therein.

The expected data generator 29 develops expected data for each test address. The development of the expected data is synchronous with the generation of the associated test address; expected data for a specific test address is developed three clock cycles after the generation of the specific test address. The expected data is provided for the comparator 31.

The comparator 31 is responsive to the diagnosis enable signal 36 for comparing the output data received from the RAM 22 with the expected data received from the expected data generator 29. When the diagnosis enable signal 36 is enabled and the output data received from the RAM 22 does not match with the expected data received from the expected data generator 29, the comparator 31 disenables the address update enable signal 32 for indicating the address generator 23 to stop updating the test address. When the diagnosis enable signal 36 is disenabled, or when the output data received from the RAM 22 matches the expected data received from the expected data generator 29, the comparator 31 enables the address update enable signal 36.

The fault diagnosis method, involving testing the RAM 22 using the fault diagnosis circuit 21, is composed of a test data write step, a first test step, and one or more subsequent test steps following the first test step.

The test data write step involves writing test data onto the RAM 22. In this embodiment, data of "0" is written each even-numbered address of the RAM 22, and data of "F" (or data of "15" in the decimal notation) is written to each odd-numbered address. Writing the test data on the RAM 22 is successively performed synchronously with the clock signal provided therefor.

The test data write step is followed by the first test step. The first test step begins with resetting the fault diagnosis start address register 25. The first test is then performed from a start address, continuously supplying the clock signal to the fault diagnosis circuit 21 and the RAM 22 with the first test indication signal 34 activated. During the first test, the address contained in the fault diagnosis start address register 25 is inputted to the fault diagnosis enable generator 26. After the supply of the clock signal over clock cycles sufficient to test all of the addresses of the RAM 22, the test address developed on the output of the address holding register 24 is written onto the fault diagnosis start address register 25. When there are one or more errors in the RAM 22, this results in that the fault diagnosis start address register 25 is set to the lowest error address, and that the output data register 28 holds the data obtained from the lowest error address, since the address generator 23 stops updating the test address in response to the address update enable signal 32 being disenabled. The error address is then externally outputted from the fault diagnosis start address register 25, and the data obtained from the error address is externally outputted from the output data register 28.

One or more subsequent tests are performed after the first test when any error is found during the first test. At the beginning of the second test, the fault diagnosis start address register 25 contains the lowest error address. The second test is performed, continuously supplying the clock signal to the fault diagnosis circuit 21 and the RAM 22. After supplying the clock signal over clock cycles sufficient to test all of the addresses of the RAM 22, the test address developed on the output of the address holding register generator 24, which is the second lowest error address if one or more other errors exist, is written to the fault diagnosis start address register 25. The second lowest error address is then externally outputted from the fault diagnosis start address register 25, and the data obtained from the second lowest error address is externally outputted from the output data register 28. The thus-described test is repeated until no additional error is found during the test.

Figure 4:
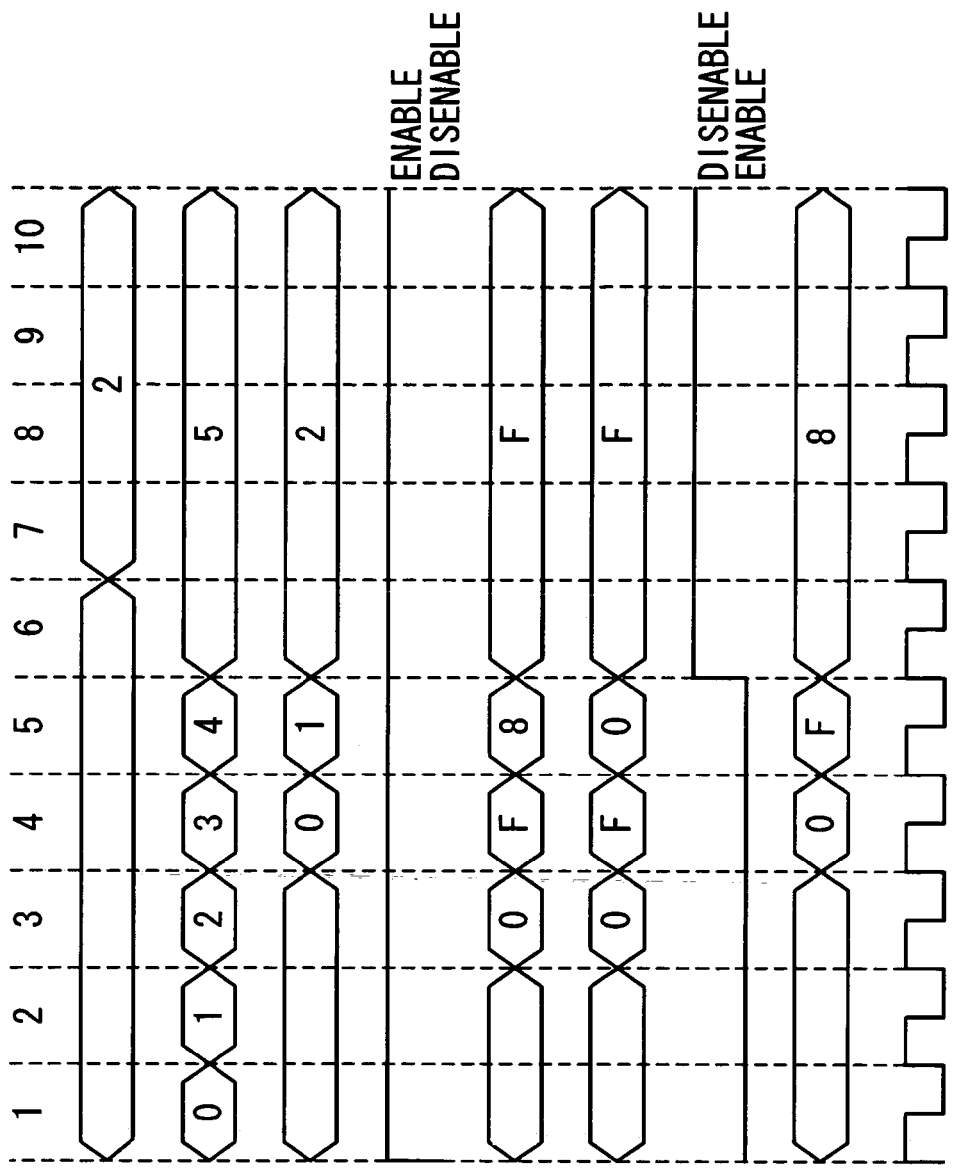
FIG. 4 is a timing chart showing operations of the fault diagnosis circuit shown in FIG. 2 during the first test.

FIG. 4 is a timing chart illustrating an exemplary operation of the fault diagnosis circuit 1 during the first test, with assumptions that the RAM 22 outputs wrong data of "8" for the address #2 and outputs wrong data of "3" for the address #4. During the first test, the fault diagnosis enable generator 26 unconditionally enables the diagnosis enable signal 36 in response to the first test indication signal 34 being activated.

At the first clock cycle, the address generator 23 initializes the test address to the start address, that is, the address #0. The comparator 31 initially enables the address update enable signal 32 at the first clock cycle.

At the second clock cycle, the address generator 23 updates the test address to the address #1, which is the next address of the address #0. The comparator 31 retains the address update enable signal 32 enabled at the second clock cycle. Additionally, the RAM 22 outputs data of "0" stored in the address #0 at the second clock cycle, in response to the test address being set to the address #0 at the first clock cycle.

At the third clock cycle, the address generator 23 updates the test address to the address #2 in response to the address update enable signal 32 being enabled at the second clock cycle. Additionally, the output data register 27 outputs the data of "0" associated with the address #0, received from the RAM 22 at the second clock cycle. In the meantime, the expected data generator 29 outputs expected data of "0" at the third clock cycle, the expected data being associated with the address #0. The comparator 31 continues to enable the address update enable signal 32 at the third clock cycle. Finally, the RAM 22 outputs data of "F" stored in the address #1 at the third clock cycle, in response to the test address being set to the address #1 at the second clock cycle.

At the fourth clock cycle, the address generator 23 updates the test address to the address #3 in response to the address update enable signal 32 being enabled at the third clock cycle. At the fourth clock cycle, the address holding register 24 outputs the address #0 on the output of the output stage, which is developed by the address generator 23 at the first clock cycle. Additionally, the output data register 27 outputs the data of "F" associated with the address #1, received from the RAM 22 at the third clock cycle. In the meantime, the expected data generator 29 outputs expected data of "F" at the fourth clock cycle, the expected data being associated with the address #1. Furthermore, the comparator 31 compares the data received from the output data register 27 at the third clock cycle, which is the output data obtained from the address #0 of the RAM 22, with the expected data associated with the address #0, received from the expected value generator 29 at the third clock cycle. In response to the comparison result, the comparator 31 enables the address update enable signal 32 at the fourth clock cycle. Finally, the RAM 22 outputs data of "8" stored in the address #2 at the fourth clock cycle, in response to the test address being set to the address #2 at the third clock cycle. It should be noted that the data stored in the address #2 does not match the expected data associated with the address #2.

At the fifth clock cycle, the address generator 23 updates the test address to the address #4 in response to the address update enable signal 32 being enabled at the fourth clock cycle. At the fifth clock cycle, the address holding register 24 outputs the address #1 on the output of the output stage, which is developed by the address generator 23 at the second clock cycle. Additionally, the output data register 27 outputs the data of "8" associated with the address #2, received from the RAM 22 at the fourth clock cycle. In the meantime, the expected data generator 29 outputs expected data of "0" at the fifth clock cycle, the expected data being associated with the address #2. Furthermore, the comparator 31 compares the output data obtained from the address #1 of the RAM 22, received from the output data register 27 at the fourth clock cycle, with the expected data associated with the address #1, received from the expected value generator at the fourth clock cycle. In response to the comparison result, the comparator 31 enables the address update enable signal 32 at the fifth clock cycle. Finally, the RAM 22 outputs data of "F" stored in the address #3 at the fifth clock cycle, in response to the test address being set to the address #3 at the fourth clock cycle.

At the sixth clock cycle, the address generator 23 updates the test address to the address #5 in response to the address update enable signal 32 being enabled at the fifth clock cycle. At the sixth clock cycle, the address holding register 24 outputs the address #2 on the output of the output stage, which is developed by the address generator 23 at the third clock cycle. Additionally, the output data register 27 outputs the data of "F" associated with the address #3, received from the RAM 22 at the fifth clock cycle. In the meantime, the expected data generator 29 outputs expected data of "F" at the sixth clock cycle, the expected data being associated with the address #3. Furthermore, the comparator 31 compares the output data obtained from the address #2 of the RAM 22, received from the output data register 27, with the expected data associated with the address #2. In response to the fact that the output data obtained from the address #2 does not match the associated expected data, the comparator 31 disenables the address update enable signal 32 at the six clock cycle. Finally, the RAM 22 outputs the data stored in the address #4 at the sixth clock cycle.

In response to the address update enable signal 32 being disenabled, the address generator 23 stops updating the test address at the seventh clock cycle. This results in that the address generator 23 continues to output the address #5 at the seventh and subsequent clock cycles. Additionally, the address holding register 24 starts to retain the address stored therein unchanged in response to the address update enable signal 32 being disenabled. This results in that the address holding register 24 continues to output the address #2, which is the lowest error address, at the seventh and subsequent clock cycles. The fault diagnosis start address register 25 is updated to the lowest error address, that is, the address #2. Additionally, the output data register 28 starts to retain the output data stored therein in response to the address update enable signal 32 being disenabled. This allows external access to the output data associated with the lowest error address.

Figure 5:
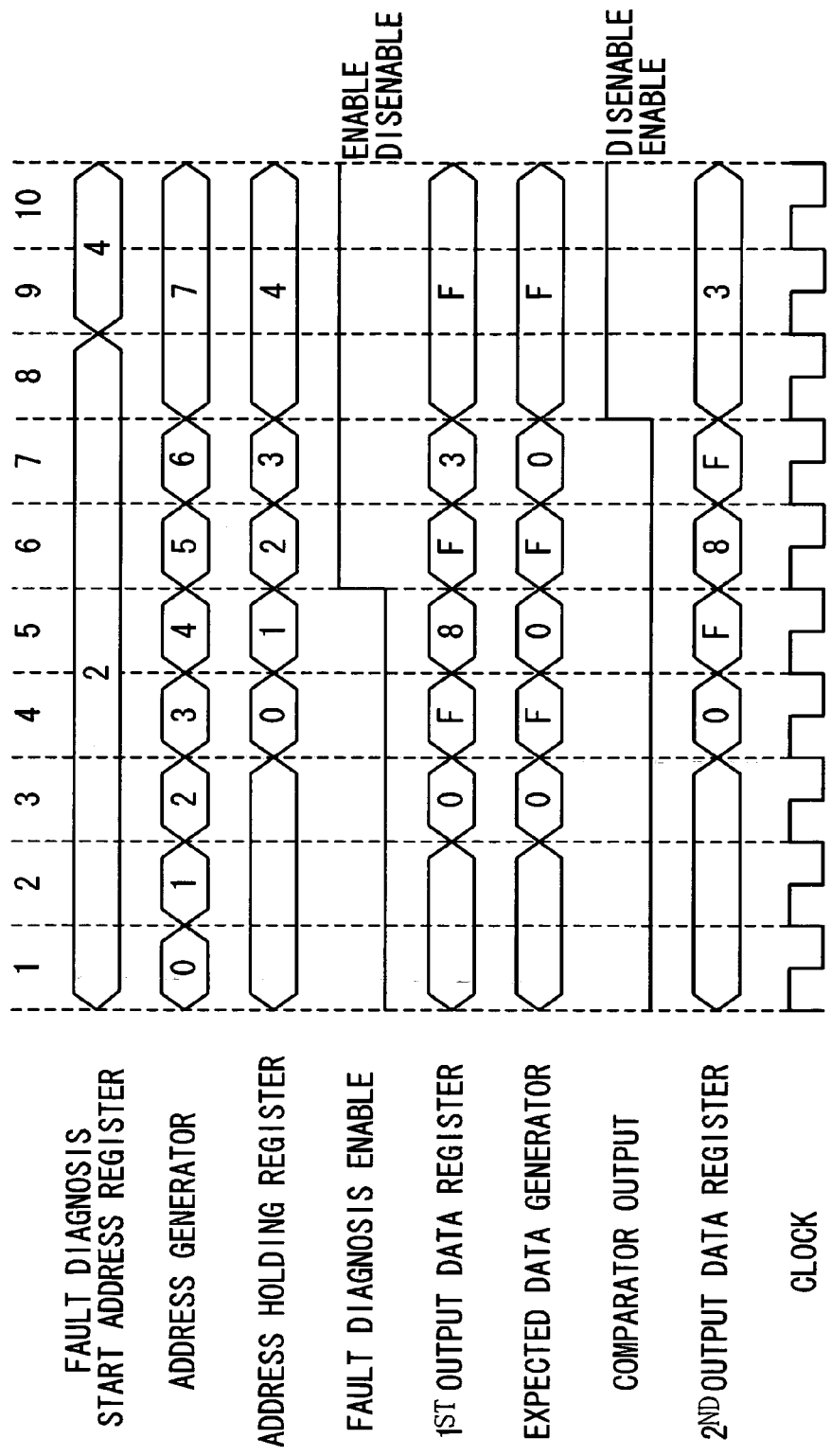
FIG. 5 is a timing chart showing operations of the fault diagnosis circuit shown in FIG. 2 during the second test.

FIG. 5 is a timing chart illustrating an exemplary operation of the fault diagnosis circuit 1 during the second test, performed after the above-described first test. It should be noted that the RAM 22 is assumed to output wrong data of "8" for the address #2, and to output wrong data of "3" for the address #4.

When the second test is started, the fault diagnosis start address register 25 contains the address #2, which is the lowest error address detected during the first test. The second test is started from the same start address as the first test, that is, the address #0. In response to the second test being started, the first test indication signal 34 is deactivated.

At the first clock cycle, the address generator 23 sets the test address to the address #0, which is the start address. The fault diagnosis enable generator 26, in response to the first test indication signal 34 being deactivated, disenables the diagnosis enable signal 36. The comparator 31 enables the address update enable signal 32 at the first clock cycle without performing any comparison.

At the second clock cycle, the address generator 23 updates the test address to the address #1 in response to the address update enable signal 32 being enabled at the first clock cycle. In response to the first test indication signal 34 being deactivated, the fault diagnosis enable generator 26 disenables the diagnosis enable signal 36 at the second clock cycle. The comparator 31, on the other hand, enables the address update enable signal 32 in response to the fault enable signal 36 being disenabled at the first clock cycle. Additionally, the RAM 22 outputs data of "0" associated with the address #0, in response to the test address being set to the address #0 at the first clock cycle.

At the third clock cycle, the address generator 23 updates the test address to the address #2 in response to the address update enable signal 32 being enabled at the second clock cycle. Additionally, the address holding register 24 provides the diagnosis enable generator 26 with the address #0, which is developed by the address generator at the first clock cycle. The fault diagnosis enable generator 26 disenables the diagnosis enable signal 36 at the third clock cycle, in response to the fact that the address #0 received from the address holding register 24 is lower than the lowest error address contained in the fault diagnosis start address register 25, with the first test indication signal 34 deactivated. The output data register 27 outputs the data of "0" associated with the address #0, received from the RAM 22 at the second clock cycle. In the meantime, the expected data generator 29 outputs expected data of "0" at the third clock cycle, the expected being associated with the address #0. The comparator 31 continues to enable the address update enable signal 32 at the third clock cycle, in response to the diagnosis enable signal 36 being disenabled at the second clock cycle. Finally, the RAM 22 outputs data of "F" associated with the address #1 at the third clock cycle, in response to the test address being set to the address #1 at the second clock cycle.

At the fourth clock cycle, the address generator 23 updates the test address to the address #3 in response to the address update enable signal 32 being enabled at the third clock cycle. At the fourth clock cycle, the address holding register 24 develops the address #0 on the output of the output stage, and also provides the diagnosis enable generator 26 with the address #1 from the second stage, which is developed by the address generator 23 at the second clock cycle. The fault diagnosis enable generator 26 disenables the diagnosis enable signal 36 at the fourth clock cycle, in response to the fact that the address #1 received from the address holding register 24 is lower than the lowest error address (that is, the address #2) contained in the fault diagnosis start address register 25, with the first test indication signal 34 deactivated. Additionally, the output data register 27 outputs the data of "F" associated with the address #1, received from the RAM 22 at the third clock cycle. In the meantime, the expected data generator 29 outputs expected data of "F" at the fourth clock cycle, the expected data being associated with the address #1. The comparator 31 enables the address update enable signal 32 at the fourth clock cycle, in response to the diagnosis enable signal 36 being disenabled at the third clock cycle. The output data register 28 holds the data of "0" received from the output data register 27 at the third clock cycle. Finally, the RAM 22 outputs data of "8" stored in the address #2 at the fourth clock cycle, in response to the test address being set to the address #2 at the third clock cycle.

At the fifth clock cycle, the address generator 23 updates the test address to the address #4 in response to the address update enable signal 32 being enabled at the fourth clock cycle. At the fifth clock cycle, the address holding register 24 develops the address #1 on the output of the output stage, and also provides the diagnosis enable generator 26 with the address #2 from the second stage, which is developed by the address generator 23 at the third clock cycle. The fault diagnosis enable generator 26 disenables the diagnosis enable signal 36 at the fifth clock cycle, in response to the fact that the address #2 received from the address holding register 24 is equal to the lowest error address contained in the fault diagnosis start address register 25, with the first test indication signal 34 deactivated. Additionally, the output data register 27 outputs the data of "8" associated with the address #2, received from the RAM 22 at the fourth clock cycle. In the meantime, the expected data generator 29 outputs expected data of "0" at the fifth clock cycle, the expected data being associated with the address #2. Although detecting an error at the address #2, the comparator 31 continues to enable the address update enable signal 32 at the fifth clock cycle in response to the diagnosis enable signal 36 being disenabled at the fourth clock cycle. The output data register 28 holds the data of "F" received from the output data register 27 at the fourth clock cycle. Finally, the RAM 22 outputs data of "F" stored in the address #3 at the fifth clock cycle, in response to the test address being set to the address #3 at the fourth clock cycle.

At the sixth clock cycle, the address generator 23 updates the test address to the address #5 in response to the address update enable signal 32 being enabled at the fifth clock cycle. At the sixth clock cycle, the address holding register 24 develops the address #2 on the output of the output stage, and also provides the diagnosis enable generator 26 with the address #3 from the second stage, which is developed by the address generator 23 at the fourth clock cycle. The fault diagnosis enable generator 26 enables the diagnosis enable signal 36 at the sixth clock cycle, in response to the fact that the address #3 received from the address holding register 24 is higher than the lowest error address #2, contained in the fault diagnosis start address register 25, with the first test indication signal 34 deactivated. Additionally, the output data register 27 outputs the data of "F" associated with the address #3, received from the RAM 22 at the fifth clock cycle. In the meantime, the expected data generator 29 outputs expected data of "F" at the sixth clock cycle, the expected data being associated with the address #3. The comparator 31 enables the address update enable signal 32 at the sixth clock cycle, in response to the diagnosis enable signal 36 being disenabled at the fifth clock cycle. The output data register 28 holds the data of "8" received from the output data register 27 at the fifth clock cycle. Finally, the RAM 22 outputs data of "0" stored in the address #4 at the six clock cycle, in response to the test address being set to the address #4 at the fifth clock cycle.

At the seventh clock cycle, the address generator 23 updates the test address to the address #6 in response to the address update enable signal 32 being enabled at the sixth clock cycle. At the seventh clock cycle, the address holding register 24 develops the address #3 on the output of the output stage, and also provides the diagnosis enable generator 26 with the address #4 from the second stage, which is developed by the address generator 23 at the fifth clock cycle. The fault diagnosis enable generator 26 enables the diagnosis enable signal 36 at the seventh clock cycle, in response to the fact that the address #4 received from the address holding register 24 is higher than the lowest error address #2, contained in the fault diagnosis start address register 25, with the first test indication signal 34 deactivated. Additionally, the output data register 27 outputs the data of "3" associated with the address #A, received from the RAM 22 at the sixth clock cycle. In the meantime, the expected data generator 29 outputs expected data of "0" at the seventh clock cycle, the expected data being associated with the address #4. The comparator 31 enables the address update enable signal 32 at the seventh clock cycle, in response to the fact that the output data of "F" received from the output data register 27 at the sixth clock matches the expected data of "F" received from the expected data generator 29 at the sixth clock cycle. The output data register 28 holds the data of "F" received from the output data register 27 at the sixth clock cycle. Finally, the RAM 22 outputs data of "F" stored in the address #5 at the seventh clock cycle, in response to the test address being set to the address #5 at the sixth clock cycle.

At the eighth clock cycle, the address generator 23 updates the test address to the address #7 in response to the address update enable signal 32 being enabled at the seventh clock cycle. At the eighth clock cycle, the address holding register 24 develops the address #4 on the output of the output stage, and also provides the diagnosis enable generator 26 with the address #5 from the second stage, which is developed by the address generator 23 at the fifth clock cycle. The fault diagnosis enable generator 26 enables the diagnosis enable signal 36 at the eighth clock cycle, in response to the fact that the address #5 received from the address holding register 24 is higher than the lowest error address #2, contained in the fault diagnosis start address register 25, with the first test indication signal 34 deactivated. Additionally, the output data register 27 outputs the data of "F" associated with the address #5, received from the RAM 22 at the seventh clock cycle. In the meantime, the expected data generator 29 outputs expected data of "F" at the seventh clock cycle, the expected data being associated with the address #5. The comparator 31 disenables the address update enable signal 32 at the eighth and subsequent clock cycles, in response to the fact that the output data of "3" received from the output data register 27 at the seventh clock does not match the expected data of "0" received from the expected data generator 29 at the seventh clock cycle. The output data register 28 holds the data of "3" received from the output data register 27 at the seventh clock cycle.

In response to the address update enable signal 32 being disabled at the eighth and subsequent clock cycles, the address generator 23 stop updating the test address, with the test address fixed at the address #7 after the eighth clock cycle. This results in that the address holding register 24 continues to develop the address #4 on the output of the output stage thereof after the eight clock cycle. The fault diagnosis start address register 25 latches the address #4, which is the second lowest error address, at the ninth clock cycle. The second lowest error address contained in the fault diagnosis start address register 25 is externally accessible through the signal line 33. The output data register 28 continuously contains the output data of "3" stored in the second lowest error address, that is, the address #4 after the eighth clock cycle, in response to the address update enable signal 32 being disenabled.

As described above, the fault diagnosis method in this embodiment allows the detection of the complete sets of the error address(es) and the data stored in the error address(es) with a reduced memory. Additionally, the fault diagnosis method in this embodiment provides the detection of the speed-dependent error(s) within the RAM 22 through operating the RPM 22 at the actual operation frequency.

Third and Fourth Embodiments

Figure 6:
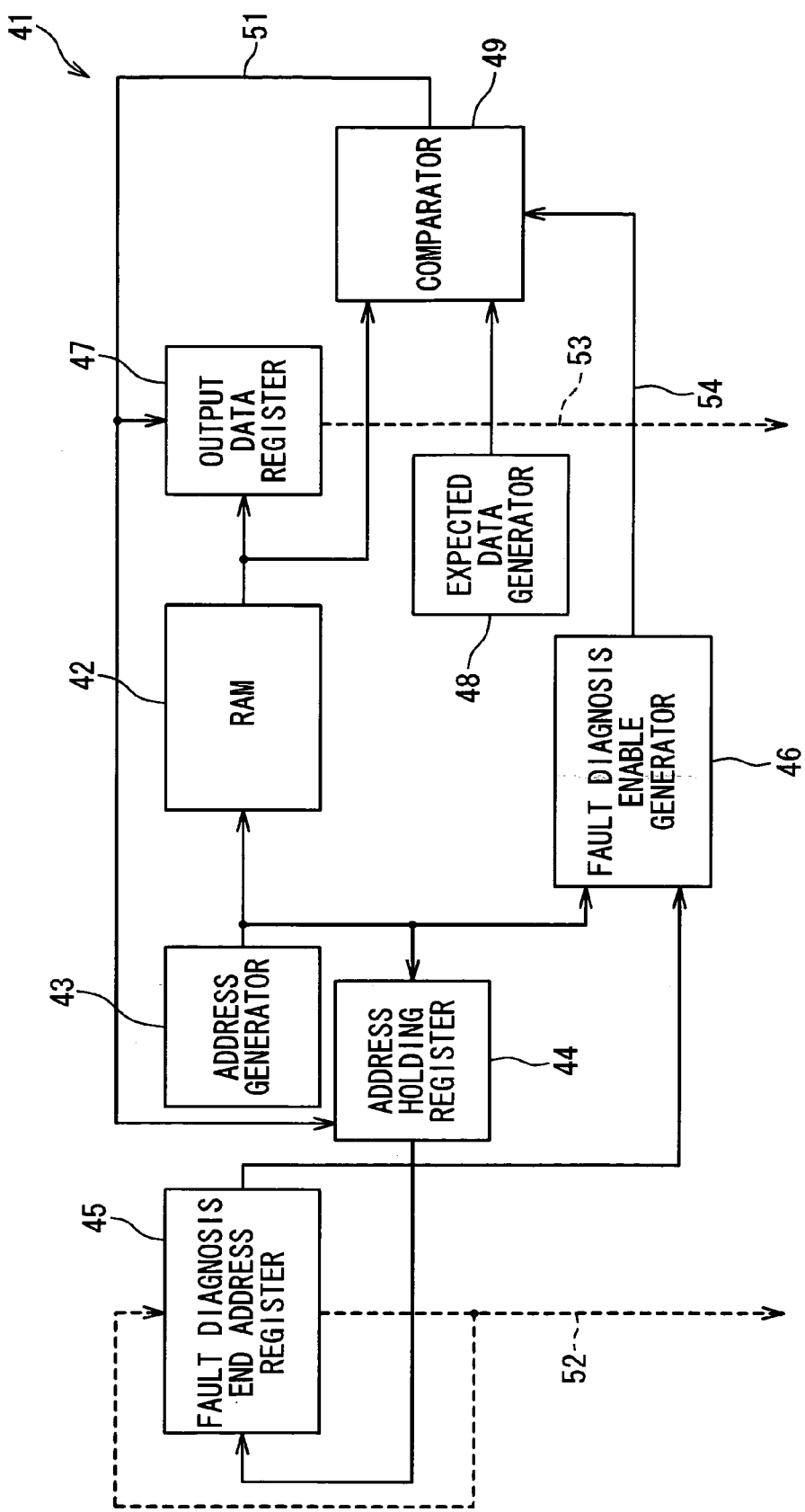
FIG. 6 is a block diagram showing an exemplary structure of the fault diagnosis circuit in still another embodiment of the present invention.

FIG. 6 is a block diagram showing an exemplary structure of the fault diagnosis circuit in a fourth embodiment of the present invention. The fault diagnosis circuit shown in FIG. 6 is designed to implement a fault diagnosis method different from those described in the above-described embodiments.

In this embodiment, a fault diagnosis circuit 41 and an RAM 42 are monolithically integrated within a single semiconductor chip. The fault diagnosis circuit 41 is designed to test the RAM 42. The RAM 42 includes a plurality of memory cells identified by associated addresses. For simplicity, it is assumed that the address of the RAM 42 ranges from 0 to 7, represented by four bits. When a write address and a write data are externally inputted during a write operation, the RAM 42 stores the write data in the memory cell associated with the write address. When a read address is inputted during a read operation, the RAM 42 outputs the data stored in the memory cell associated with the read address. The RAM 42 is designed to be synchronous with rising edges of a clock signal provided therefor, and when a read request is issued with a read address at a certain clock cycle, the RAM 42 outputs desired data associated with the read address at the next clock cycle.

The fault diagnosis circuit 41 includes an address generator 43, an address holding register 44, a fault diagnosis end address register 45, a fault diagnosis enable generator 46, an output data registers 47, an expected data generator 48, and a comparator 49.

The address generator 43 generates and updates the test address for the RAM 42. The update of the test address is synchronous with a clock signal; the address generator 43 increases the test address for each clock cycle. The address generator 43 is typically composed of a counter.

The address holding register 44 is designed to latch the test address from the address generator 43 in response to an address update enable signal 51 received from a comparator 49. When the address update enable signal 51 is enabled, the address holding register 44 latches the test address from the address generator 43; this results in that the test address stored in the address holding register 44 is updated. When the address update enable signal 51 is disenabled, the address holding register 44 retains the test address stored therein at the previous clock cycle.

The fault diagnosis end address register 45 is used to store a diagnosis end address. The fault diagnosis end address register 45 is connected to the address holding register 44, and designed to latch the address from the address holding register 44. The fault diagnosis end address register 45 is externally accessible through a signal line 52. The signal line 52 provides a feed back loop from the shift output to the shift input for the fault diagnosis end address register 45. This allows the fault diagnosis end address register 45 to retain the address after the stored address is shifted out, and eliminates the need for restoring the outputted address into the fault diagnosis end address register 45.

The fault diagnosis enable generator 46 provides the comparator 49 with a diagnosis enable signal 54 in response to the test address received from the address generator 43, and the diagnosis end address stored in the fault diagnosis end address register 45. When the test address received from the address generator 43 is lower than the diagnosis end address received from the fault diagnosis end address register 45, the fault diagnosis enable generator 46 enables the diagnosis enable signal 54 to activate the comparator 49. When the test address received from the address generator 43 is equal to or higher than the address received from the fault diagnosis end address register 45, on the other hand, the fault diagnosis enable generator 46 disenables the diagnosis enable signal 54 to deactivate the comparator 49.

The output data register 47 is designed to latch output data received from the RAM 42 in response to the address update enable signal 51. When the address update enable signal 51 is disenabled, the output data register 47 retains the data stored therein. When the address update enable signal 51 is enabled, on the other hand, the output data register 47 latches the output data received from the RAM 42. The output data register 47 is externally accessible through a signal line 53. When requested, the output data register 47 externally outputs the data stored therein.

The expected data generator 48 develops expected data for each test address. The expected data developed is provided for the comparator 49.

The comparator 49 is responsive to the diagnosis enable signal 54 for comparing the output data received from the RAM 42 with the expected data received from the expected data generator 48. When the diagnosis enable signal 54 is disenabled, or when the output data received from the RAM 42 matches the expected data received from the expected data generator 48, the comparator 49 disenables the address update enable signal 51. When the output data received from the RAM 42 does not match the expected data received from the expected data generator 48 with the diagnosis enable signal 36 enabled, the comparator 49 enables the address update enable signal 51 for allowing the address holding register 44 to update the test address stored therein. It should be noted that the fault diagnosis circuit 41 shown in FIG. 6 is designed to update the test address stored in the address holding register 44, when the output data received from the RAM 42 does not match the associated expected data. This implies that the test address stored in the address holding register 44 is the most recently found error address which has ever been found. Accordingly, the address update enable signal 51 is enabled when the output data received from the RAM 42 does not match the associated expected data with the diagnosis enable signal 54 enabled.

The fault diagnosis method in this embodiment, involving testing the RAM 42 using the fault diagnosis circuit 41, is composed of a test data write step, a first test step, and one or more subsequent test steps following the first test step.

The test data write step involves writing test data onto the RAM 42. In this embodiment, data of "0" is written each even-numbered address of the RAM 42, and data of "F" (or data of "15" in the decimal notation) is written to each odd-numbered address.

The test data write step is followed by the first test step. The first test step begins with initializing the fault diagnosis end address register 45, setting the address #8 into the fault diagnosis end address register 45. It should be noted that the address set to the fault diagnosis end address register 45 is higher than any address defined for the RAM 42; the highest address is the address #7 in the RAM 42. The first test is then performed from a start address, continuously supplying the clock signal to the fault diagnosis circuit 41 and the RAM 42. After the supply of the clock signal over clock cycles sufficient to test all of the addresses of the RAM 42, the test address developed on the output of the address holding register 44 is written onto the fault diagnosis start address register 45. When there are one or more errors in the RAM 42, this results in that the fault-diagnosis end address register 45 is set to the highest error address which has ever been found, since the address holding register 44 is updated only when the output data received from the RAM 42 does not match the associated expected data. After the first test, the output data register 47 contains the output data associated with the highest error address, since the output data register 47 latches the output data from the RAM 42 only when the output data received from the RAM 42 does not match the associated expected data. The error address stored in the fault diagnosis end address register 45 and the associated output data stored in the output data register 47 are externally outputted through the signal lines 52 and 54.

One or more subsequent tests are performed after the first test when any error is found during the first test. The second test is performed, continuously supplying the clock signal to the fault diagnosis circuit 41 and the RAM 42. After supplying the clock signal over clock cycles sufficient to test all of the addresses of the RAM 42, the test address developed on the output of the address holding register generator 54, which is the second highest error address if one or more other errors exist, is written to the fault diagnosis end address register 45. The second highest error address is then externally outputted from the fault diagnosis end address register 45, and the data obtained from the second highest error address is externally outputted from the output data register 47. The thus-described test is repeated until no additional error is found during the test.

The fault diagnosis method thus-described effectively reduces hardware for storing error addresses; the fault diagnosis circuit 41 is required to store only one error address for externally obtaining all the error addresses.

Figure 7:
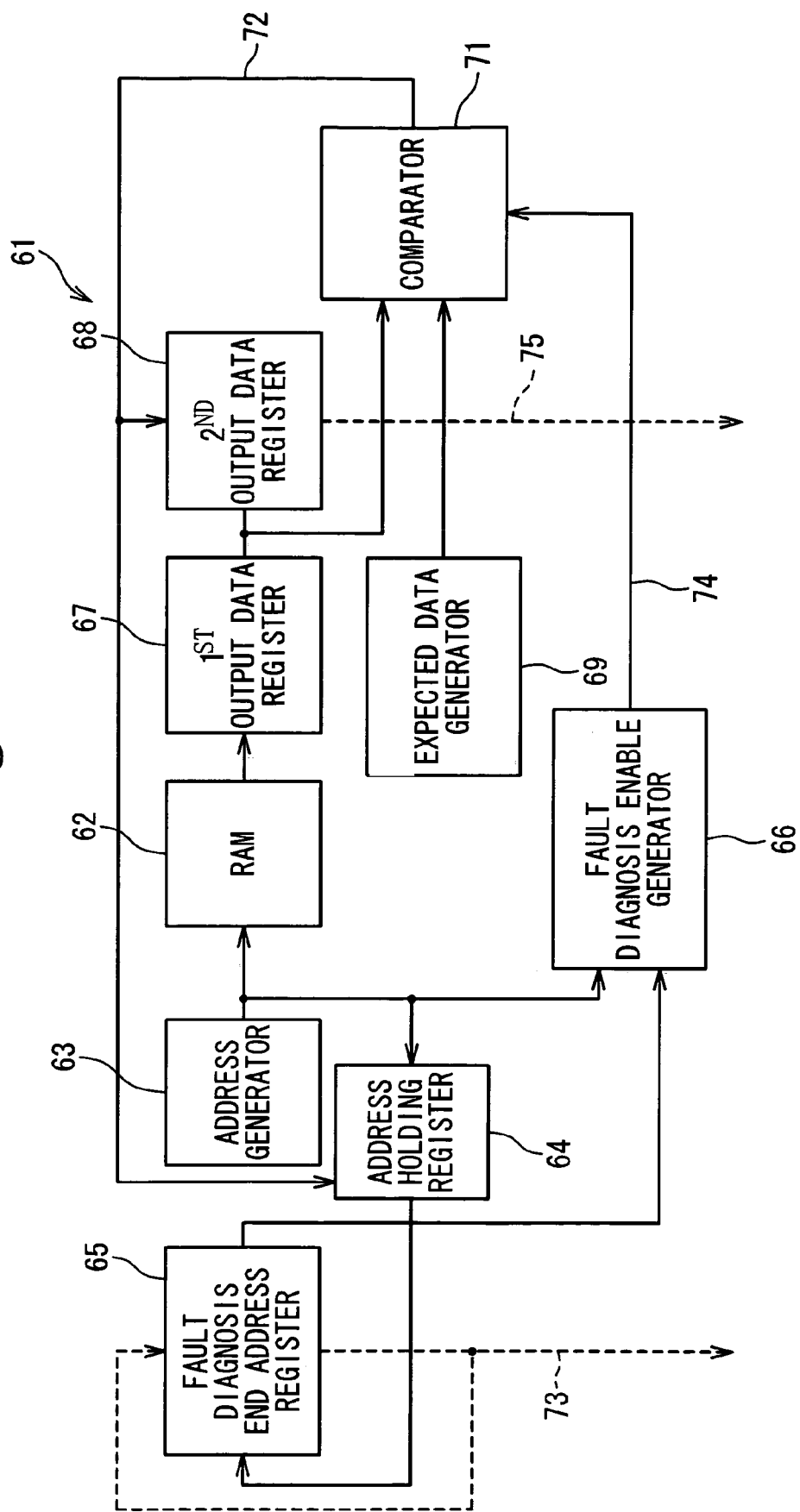
FIG. 7 is a block diagram showing an exemplary structure of the fault diagnosis circuit in still another embodiment of the present invention.

FIG. 7 is a block diagram showing an exemplary structure of the fault diagnosis circuit in a fourth embodiment of the present invention. A fault diagnosis circuit 61 and an RAM 62 are monolithically integrated within a single semiconductor chip. The fault diagnosis circuit 61 is designed to test the RAM 62. The RAM 62 includes a plurality of memory cells identified by associated addresses. For simplicity, it is assumed that the address of the RAM 62 ranges from 0 to 7, represented by four bits. When a write address and a write data are externally inputted during a write operation, the RAM 62 stores the write data in the memory cell associated with the write address. When a read address is inputted during a read operation, the RAM 62 outputs the data stored in the memory cell associated with the read address.

The structure of the fault diagnosis circuit 61 is similar to that of the fault diagnosis circuit 41 shown in FIG. 6, in exception that the fault diagnosis circuit 61 is adapted to the fact that an synchronous DRAM is used as the RAM 62; the RAM 62 exhibits data read latency, outputting data stored in a selected memory cell one or more clock cycles after receiving the address associated with the selected memory cell.

Specifically, the fault diagnosis circuit 61 includes an address generator 63, an address holding register 64, a fault diagnosis end address register 65, a fault diagnosis enable generator 66, a set of first and second output data registers 67 and 68, an expected data generator 69, and a comparator 61. The difference from the fault diagnosis circuit 41 shown in FIG. 6 is that the a pair of serially-connected output data registers is additionally incorporated within the fault diagnosis circuit 61, and that the address holding register 64 is designed to operate differently from the address holding register 44 within the fault diagnosis circuit 41.

The address generator 63 generates and updates the test address for the RAM 62. The update of the test address is synchronous with a clock signal; the address generator 63 increases the test address for each clock cycle. The address generator 63 is typically composed of a counter.

The address holding register 64 is composed of a three-stage shift register designed to hold the test addresses received from the address generator 63 for three clock cycles. The first stage (or the input stage) of the address holding register 64 latches the test address from the address generator 63, and the received test address is then transferred to the second stage (or the middle stage). The second stage of the address holding register 64 latches the test address from the first stage thereof. The third stage of the address holding register 64, differently from the first and second stages, is responsive to an address update enable signal 72 for latching the test address from the second stage; the address stored in the third stage is updated only when the address update enable signal 72 is enabled. The output of the third stage of the address holding register 64 is connected to the fault diagnosis end address register 65.

The fault diagnosis end address register 65 is designed to latch the test address from the address holding register 64. The fault diagnosis end address register 65 is externally accessible through a signal line 73. The signal line 73 provides a feed back loop from the shift output to the shift input for the fault diagnosis end address register 65. This allows the fault diagnosis end address register 65 to retain the address after the stored address is shifted out, and eliminates the need for restoring the outputted address into the fault diagnosis end address register 65.

The fault diagnosis enable generator 66 compares the test address received from the address generator 63 with the diagnosis end address received from the fault diagnosis end address register 65 to develop a diagnosis enable signal 74. When the test address received from the address generator 63 is equal to or higher than the diagnosis end address received from the fault diagnosis end address register 65, the fault diagnosis enable generator 66 enables the diagnosis enable signal 74 to deactivate the comparator 71. When the test address received from the address generator 63 is equal to or higher than the address received from the fault diagnosis end address register 65, on the other hand, the fault diagnosis enable generator 66 disenables the diagnosis enable signal 74 to deactivate the comparator 71.

The first output data register 67 is designed to latch output data received from the RAM 62, and to contain the latched data for one clock cycle. The output of the first output data register 67 is connected to the second output data register 68 and the comparator 71.

The second output data register 68 is responsive to the address update enable signal 72 to latch the output data from the first output data register 67. When the address update enable signal 72 is enabled, the second output data register 68 latches the output data from the first output data register 67 in synchronization with the clock signal. When the address update enable signal 72 is disenabled, the second output data register 68 retains the data stored therein.

The expected data generator 69 develops expected data for each test address. The development of the expected data is synchronous with the generation of the associated test address; expected data for a specific test address is developed three clock cycles after the generation of the specific test address. The expected data is provided for the comparator 71.

The comparator 71 is responsive to the diagnosis enable signal 74 for comparing the output data received from the RAM 62 with the expected data received from the expected data generator 69 to develop the address update enable signal 72. When the diagnosis enable signal 74 is disenabled, the comparator 71 unconditionally disenables the address update enable signal 72. When the diagnosis enable signal 74 is enabled, the comparator 71 compares the output data received from the RAM 62 with the associated expected data. When the output data received from the RAM 62 matches the expected data received from the expected data generator 69 with the diagnosis enable signal 74 enabled, the comparator 71 disenables the address update enable signal 72. When the output data received from the RAM 62 does not match the expected data received from the expected data generator 69 with the diagnosis enable signal 74 enabled, on the other hand, the comparator 71 enables the address update enable signal 72 for allowing the third stage of the address holding register 64 to update the test address stored therein.

The fault diagnosis method in this embodiment, involving testing the RAM 62 using the fault diagnosis circuit 61, is composed of a test data write step, a first test step, and one or more subsequent test steps following the first test step.

The test data write step involves writing test data onto the RAM 62. In this embodiment, data of "0" is written each even-numbered address of the RAM 62, and data of "F" (or data of "15" in the decimal notation) is written to each odd-numbered address.

The test data write step is followed by the first test step. The first test step begins with initializing the fault diagnosis end address register 65, setting the address #8 into the fault diagnosis end address register 65. It should be noted that the diagnosis end address set to the fault diagnosis end address register 65 is higher than the test end address of the RAM 62; the test end address is the address #7 in the RAM 62. The first test is then performed from a start address, continuously supplying the clock signal to the fault diagnosis circuit 61 and the RAM 62. After the supply of the clock signal over clock cycles sufficient to test all of the addresses of the RAM 62, the test address developed on the output of the third stage of the address holding register 64 is written onto the fault diagnosis start address register 65. When there are one or more errors in the RAM 62, this results in that the fault diagnosis end address register 65 is set to the highest error address which has ever been found, since the third stage of the address holding register 64 is updated only when the output data received from the RAM 62 does not match the associated expected data. After the first test, the second output data register 68 contains the output data associated with the highest error address, since the output data register 68 latches the output data from the RAM 62 only when the output data received from the RAM 62 does not match the associated expected data. The error address stored in the fault diagnosis end address register 65 and the associated output data stored in the second output data register 68 are externally outputted through the signal lines 73 and 75.

One or more subsequent tests are performed after the first test when any error is found during the first test. The second test is performed, continuously supplying the clock signal to the fault diagnosis circuit 61 and the RAM 62. After supplying the clock signal over clock cycles sufficient to test all of the addresses of the RAM 62, the test address developed on the output of the address holding register generator 64, which is the second highest error address if one or more other errors exist, is written to the fault diagnosis end address register 65. The second highest error address is then externally outputted from the fault diagnosis end address register 65, and the data obtained from the second highest error address is externally outputted from the output data register 67. The thus-described test is repeated until no additional error is found during the test.

FIG. 8 is a timing chart illustrating an exemplary operation of the fault diagnosis circuit 1 during the first test, with assumptions that the RAM 62 outputs wrong data of "8" for the address #2 and outputs wrong data of "3" for the address #4.

At the beginning of the first test, the fault diagnosis end address register 65 is initialized to the address #8. This achieves testing all the addresses within the RAM 62, allowing the diagnosis enable generator 66 to enable the diagnosis enable signal 74 in response to the fact that the test address generated by the address generator is kept lower than the diagnosis end address stored in the diagnosis enable generator 66.

At the first clock cycle, the address generator 63 initializes the test address to the start address, that is, the address #0. The comparator 71 initially disenables the address update signal 72 at the first clock cycle.

At the second clock cycle, the address generator 63 updates the test address to the address #1, which is the next address of the address #0. The comparator 71 retains the address update enable signal 72 disenabled at the second clock cycle. Additionally, the RAM 62 outputs data of "0" stored in the address #0 at the second clock cycle, in response to the test address being set to the address #0 at the first clock cycle.

At the third clock cycle, the address generator 63 updates the test address to the address #2. Additionally, the output data register 67 outputs the data of "0" associated with the address #0, received from the RAM 62 at the second clock cycle. In the meantime, the expected data generator 69 outputs expected data of "0" at the third clock cycle, the expected data being associated with the address #0. The comparator 71 continues to disenable the address update enable signal 72 at the third clock cycle. Finally, the RAM 62 outputs data of "F" stored in the address #1 at the third clock cycle, in response to the test address being set to the address #1 at the second clock cycle.

At the fourth clock cycle, the address generator 63 updates the test address to the address #3. The output data register 67 outputs the data of "F" associated with the address #1, received from the RAM 62 at the third clock cycle. In the meantime, the expected data generator 69 outputs expected data of "F" at the fourth clock cycle, the expected data being associated with the address #1. Furthermore, the comparator 71 compares the data received from the output data register 67 at the third clock cycle, which is the output data obtained from the address #0 of the RAM 62, with the expected data associated with the address #0, received from the expected value generator 69 at the third clock cycle. In response to the fact that the output data obtained from the address #0 of the RAM 62, received from the output data register 67 at the third clock cycle, matches the associated expected data received from the expected data generator 69, the comparator 71 disenables the address update enable signal 72 at the fourth clock cycle. Finally, the RAM 62 outputs data of "8" stored in the address #2 at the fourth clock cycle, in response to the test address being set to the address #2 at the third clock cycle. It should be noted that the data stored in the address #2 does not match the expected data associated with the address #2.

At the fifth clock cycle, the address generator 63 updates the test address to the address #4. The output data register 67 outputs the data of "8" associated with the address #2, received from the RAM 62 at the fourth clock cycle. In the meantime, the expected data generator 69 outputs expected data of "0" at the fifth clock cycle, the expected data being associated with the address #2. Furthermore, the comparator 71 disenables the address update enable signal 72 at the fifth clock cycle in response to the fact that the output data obtained from the address #1 of the RAM 62, received from the output data register 67 at the fourth clock cycle, matches the expected data associated with the address #1, received from the expected value generator 69 at the fourth clock cycle. Finally, the RAM 62 outputs data of "F" stored in the address #3 at the fifth clock cycle, in response to the test address being set to the address #3 at the fourth clock cycle.

At the sixth clock cycle, the address generator 63 updates the test address to the address #5. The output data register 67 outputs the data of "F" associated with the address #3, received from the RAM 62 at the fifth clock cycle. In the meantime, the expected data generator 69 outputs expected data of "F" at the sixth clock cycle, the expected data being associated with the address #3. Furthermore, the comparator 71 enables the address update enable signal 72 at the sixth clock cycle in response to the fact that the output data obtained from the address #2 of the RAM 62, received from the output data register 67 at the fifth clock cycle, does not match the expected data associated with the address #2, received from the expected value generator 69 at the fifth clock cycle. Finally, the RAM 62 outputs data of "3" stored in the address #4 at the sixth clock cycle, in response to the test address being set to the address #4 at the fifth clock cycle.

At the seventh clock cycle, the address generator 63 updates the test address to the address #6. In response to the address update enable signal 72 being enabled at the sixth clock cycle, the third stage of the address holding register 64 latches the address #2 at the seventh clock cycle, the address #2 being generated by the address generator 63 at the third clock cycle. The output data register 67 outputs the data of 11311 associated with the address #4, received from the RAM 62 at the sixth clock cycle. In the meantime, the expected data generator 69 outputs expected data of "0" at the seventh clock cycle, the expected data being associated with the address #4. Furthermore, the comparator 71 disenables the address update enable signal 72 at the seventh clock cycle in response to the fact that the output data obtained from the address #3 of the RAM 62, received from the output data register 67 at the sixth clock cycle, matches the expected data associated with the address #3, received from the expected value generator 69 at the sixth clock cycle. The second output data register 68 latches the output data of "8" associated with the address #2, received from the first output data resister 67, in response to the fact that the address update enable signal 72 being enabled at the sixth clock cycle. Finally, the RAM 62 outputs data of "F" stored in the address #5 at the seventh clock cycle, in response to the test address being set to the address #5 at the sixth clock cycle.

At the eighth clock cycle, the address generator 63 updates the test address to the address #7. The address #7 is the highest address of the RAM 62, and thus the address generator 63 continues to output the address #7 at the eighth and subsequent clock cycles. The output data register 67 outputs the data of "F" associated with the address #5, received from the RAM 62 at the seventh clock cycle. In the meantime, the expected data generator 69 outputs expected data of "F" at the eighth clock cycle, the expected data being associated with the address #5. Furthermore, the comparator 71 enables the address update enable signal 72 at the eighth clock cycle in response to the fact that the output data obtained from the address #4 of the RAM 62, received from the output data register 67 at the seventh clock cycle, does not match the expected data associated with the address #4, received from the expected value generator 69 at the seventh clock cycle. Finally, the RAM 62 outputs data of "0" stored in the address #6 at the eighth clock cycle, in response to the test address being set to the address #6 at the seventh clock cycle.

At the ninth clock cycle, the third stage of the address holding register 64 latches the address #4, which is generated by the address generator 63 at the fifth clock cycle, in response to the address update enable signal 72 being enabled at the eighth clock cycle. This results in that the highest error address of the RAM 62 is stored in the third stage (or the output stage) of the address holding register 64. The output data register 67 outputs the data of "0" associated with the address #6, received from the RAM 62 at the eighth clock cycle. In the meantime, the expected data generator 69 outputs expected data of "0" at the eighth clock cycle, the expected data being associated with the address #6. Furthermore, the comparator 71 disenables the address update enable signal 72 at the ninth clock cycle in response to the fact that the output data obtained from the address #5 of the RAM 62, received from the output data register 67 at the eighth clock cycle, matches the expected data associated with the address

5, received from the expected value generator 69 at the eighth clock cycle. The second output data register 68 latches the output data of "3" associated with the address #4, received from the first output data register 67, in response to the fact that the address update enable signal 72 being enabled at the eighth clock cycle. Finally, the RAM 62 outputs data of "F" stored in the address #7 at the eighth clock cycle, in response to the test address being set to the address #7 at the eighth clock cycle.

At the tenth clock cycle, the output data register 67 outputs the data of "F" associated with the address #7, received from the RAM 62 at the ninth clock cycle. In the meantime, the expected data generator 69 outputs expected data of "F" at the tenth clock cycle, the expected data being associated with the address #7. Furthermore, the comparator 71 disenables the address update enable signal 72 at the tenth clock cycle in response to the fact that the output data obtained from the address #6 of the RAM 62, received from the output data register 67 at the ninth clock cycle, matches the expected data associated with the address #6, received from the expected value generator 69 at ninth clock cycle.

At the eleventh clock cycle, the comparator 71 disenables the address update enable signal 72, in response to the fact that the output data obtained from the address #7 of the RAM 62, received from the output data register 67 at the tenth clock cycle, matches the expected data associated with the address #7, received from the expected value generator 69 at tenth clock cycle.

After the first test of the RAM 62 is completed (for example, at the thirteenth clock cycle), the test address stored in the third stage of the address holding register 64, which is identical to the highest error address of the RAM 62, is transferred to the fault diagnosis end address register 65. The fault diagnosis end address register 65 stores the transferred address as the diagnosis end address, hereinafter. In this embodiment, the fault diagnosis end address register 65 is set to the address #4.

FIG. 9 is a timing chart illustrating an exemplary operation of the fault diagnosis circuit 61 during the second test, performed after the above-described first test. It should be noted that the RAM 62 is assumed to output wrong data of "8" for the address #2, and to output wrong data of "3" for the address #4. When the second test is started, the fault diagnosis end address register 65 contains the address #4, which is the highest error address detected during the first test. The second test is started from the same start address as the first test, that is, the address #0.

At the first clock cycle, the address generator 63 initializes the test address to the start address, that is, the address #0. The comparator 71 initially disenables the address update signal 72 at the first clock cycle.

At the second clock cycle, the address generator 63 updates the test address to the address #1, which is the next address of the address #0. The fault diagnosis enable generator 66 enables the diagnosis enable signal 74 in response to the fact that the test address #0 developed by the address generator 63 at the first clock cycle is lower than the address #4, stored in the fault diagnosis end address register 65. The comparator 71 continues to disenable the address update enable signal 72 at the second clock cycle. Additionally, the RAM 62 outputs data of "0" stored in the address #0 at the second clock cycle, in response to the test address being set to the address #0 at the first clock cycle.

At the third clock cycle, the address generator 63 updates the test address to the address #2. The fault diagnosis enable generator 66 enables the diagnosis enable signal 74 in response to the fact that the test address #1 developed by the address generator 63 at the second clock cycle is lower than the address #4, stored in the fault diagnosis end address register 65. Additionally, the output data register 67 outputs the data of "0" associated with the address #0, received from the RAM 62 at the second clock cycle. In the meantime, the expected data generator 69 outputs expected data of "0" at the third clock cycle, the expected data being associated with the address #0. The comparator 71 continues to disenable the address update enable signal 72 at the third clock cycle. Finally, the RAM 62 outputs data of "F" stored in the address #1 at the third clock cycle, in response to the test address being set to the address #1 at the second clock cycle.

At the fourth clock cycle, the address generator 63 updates the test address to the address #3. The fault diagnosis enable generator 66 enables the diagnosis enable signal 74 in response to the fact that the test address #2 developed by the address generator 63 at the third clock cycle is lower than the address #4, stored in the fault diagnosis end address register 65. Additionally, the output data register 67 outputs the data of "F" associated with the address #1, received from the RAM 62 at the third clock cycle. In the meantime, the expected data generator 69 outputs expected data of "F" at the fourth clock cycle, the expected data being associated with the address #1. The comparator 71 disenables the address update enable signal 72 at the fourth clock cycle in response to the fact that the output data obtained from the address #0 of the RAM 62, received from the output data register 67 at the third clock cycle, matches the expected data associated with the address #0. Finally, the RAM 62 outputs data of "8" stored in the address #2 at the fourth clock cycle, in response to the test address being set to the address #2 at the third clock cycle. It should be noted that the data stored in the address #2 does not match the expected data associated with the address #2.

At the fifth clock cycle, the address generator 63 updates the test address to the address #4. The fault diagnosis enable generator 66 enables the diagnosis enable signal 74 in response to the fact that the test address #3 developed by the address generator 63 at the fourth clock cycle is lower than the address #4, stored in the fault diagnosis end address register 65. Additionally, the output data register 67 outputs the data of "8" associated with the address #2, received from the RAM 62 at the fourth clock cycle. In the meantime, the expected data generator 69 outputs expected data of "0" at the fifth clock cycle, the expected data being associated with the address #2. The comparator 71 disenables the address update enable signal 72 at the fifth clock cycle in response to the fact that the output data obtained from the address #1 of the RAM 62, received from the output data register 67 at the fourth clock cycle, matches the expected data associated with the address #1. Finally, the RAM 62 outputs data of "F" stored in the address #3 at the fifth clock cycle, in response to the test address being set to the address #3 at the fourth clock cycle.

At the sixth clock cycle, the address generator 63 updates the test address to the address #5. The fault diagnosis enable generator 66 disenables the diagnosis enable signal 74 in response to the fact that the test address #4 developed by the address generator 63 at the fourth clock cycle is NOT lower than the address #4, stored in the fault diagnosis end address register 65. The fault diagnosis enable generator 66 continuously disenables the diagnosis enable signal 74 at the sixth and subsequent clock cycles, since the test address exceeds the diagnosis end address #4, stored in the fault diagnosis end address register 65. The output data register 67 outputs the data of "F" associated with the address #3, received from the RAM 62 at the fifth clock cycle. In the meantime, the expected data generator 69 outputs expected data of "F" at the sixth clock cycle, the expected data being associated with the address #3. The comparator 71 enables the address update enable signal 72 at the sixth clock cycle in response to the fact that the output data obtained from the address #2 of the RAM 62, received from the output data register 67 at the fifth clock cycle, does NOT match the expected data associated with the address #2, with the diagnosis enable signal 74 enabled at the fourth clock cycle. Finally, the RAM 62 outputs data of "3" stored in the address #4 at the sixth clock cycle, in response to the test address being set to the address #4 at the fifth clock cycle It should be noted that the data stored in the address #4 does not match the expected data associated with the address #4.

At the seventh clock cycle, the address generator 63 updates the test address to the address #6. The third stage of the address holding register 64 latches the address #2, developed by the address generator 63 at the third clock cycle, from the second stage thereof. The output data register 67 outputs the data of "3" associated with the address #4, received from the RAM 62 at the sixth clock cycle. In the meantime, the expected data generator 69 outputs expected data of "0" at the seventh clock cycle, the expected data being associated with the address #4. The comparator 71 disenables the address update enable signal 72 at the seventh clock cycle in response to the fact that the output data obtained from the address #3 of the RAM 62, received from the output data register 67 at the sixth clock cycle, matches the expected data associated with the address #3. Finally, the RAM 62 outputs data of "F" stored in the address #5 at the seventh clock cycle, in response to the test address being set to the address #5 at the sixth clock cycle.

At the eighth clock cycle, the address generator 63 updates the test address to the address #7. The address #7 is the highest address of the RAM 62, and thus the address generator 63 continues to output the address #7 at the eighth and subsequent clock cycles. The output data register 67 outputs the data of "F" associated with the address #5, received from the RAM 62 at the seventh clock cycle. In the meantime, the expected data generator 69 outputs expected data of "F" at the eighth clock cycle, the expected data being associated with the address #5. Furthermore, the comparator 71 disenables the address update enable signal 72 at the eighth clock cycle in response to the fact that the diagnosis enable signal 74 is disenabled at the sixth and subsequent clock cycles. Finally, the RAM 62 outputs data of "0" stored in the address #6 at the eighth clock cycle, in response to the test address being set to the address #6 at the seventh clock cycle.

At the ninth clock cycle, the output data register 67 outputs the data of "0" associated with the address #6, received from the RAM 62 at the eighth clock cycle. In the meantime, the expected data generator 69 outputs expected data of "0" at the eighth clock cycle, the expected data being associated with the address #6. Finally, the RAM 62 outputs data of "F" stored in the address #7 at the eighth clock cycle, in response to the test address being set to the address #7 at the eighth clock cycle.

At the tenth clock cycle, the output data register 67 outputs the data of "F" associated with the address #7, received from the RAM 62 at the ninth clock cycle. In the meantime, the expected data generator 69 outputs expected data of "F" at the tenth clock cycle, the expected data being associated with the address #7.

After the second test of the RAM 62 is completed (for example, at the thirteenth clock cycle), the test address stored in the third stage of the address holding register 64, which is identical to the second highest error address of the RAM 62, is transferred to the fault diagnosis end address register 65. The fault diagnosis end address register 65 stores the transferred address as the diagnosis end address, hereinafter. In this embodiment, the fault diagnosis end address register 65 is set to the address #2.

The fault diagnosis method thus-described effectively reduces hardware for storing error addresses; the fault diagnosis circuit 61 is required to store only one error address for externally obtaining all the error addresses. Additionally, the fault diagnosis method in this embodiment provides the detection of the speed-dependent error(s) within the RAM 62 through operating the RAM 62 at the actual operation frequency.

Fifth Embodiment

FIG. 10 is a block diagram showing an exemplary structure of the fault diagnosis circuit in a fifth embodiment of the present invention. The fault diagnosis circuit shown in FIG. 10 is designed to implement a fault diagnosis method different from those described in the above-described embodiments.

In this embodiment, a fault diagnosis circuit 81 and an RAM 82 are monolithically integrated within a single semiconductor chip. The fault diagnosis circuit 81 is designed to test the RAM 82. The RAM 82 includes a plurality of memory cells identified by associated addresses. For simplicity, it is assumed that the address of the RAM 82 ranges from 0 to 7, represented by four bits. When a write address and a write data are externally inputted during a write operation, the RAM 82 stores the write data in the memory cell associated with the write address. When a read address is inputted during a read operation, the RAM 82 outputs the data stored in the memory cell associated with the read address. The RAM 82 is designed to be synchronous with rising edges of a clock signal provided therefor, and when a read request is issued with a read address at a certain clock cycle, the RAM 82 outputs desired data associated with the read address at the next clock cycle.

The fault diagnosis circuit 81 includes an address generator 83, an error address register 84, an output data registers 85, an expected data generator 86, and a comparator 87.

The address generator 83 generates and updates the test address for the RAM 82. The update of the test address is synchronous with a clock signal; the address generator 83 increases the test address for each clock cycle. The address generator 83 is typically composed of a counter.

The error address register 84 is designed to latch the test address from the address generator 83 in response to a data update enable signal 88 received from a comparator 87. When the data update enable signal 88 is enabled, the error address register 84 latches the test address from the address generator 83. When the data update enable signal 88 is disenabled, the error address register 84 retains the test address stored therein at the previous clock cycle. The error address register 84 is externally accessible through a signal line 91. When requested, the error address register 84 outputs the address stored therein through the signal line 91.

The output data register 85 is designed to latch output data received from the RAM 82 in response to the data update enable signal 88. When the data update enable signal 88 is enabled, the output data register 85 latches the output data received from the RAM 82. When the data update enable signal 88 is disenabled, on the other hand, the output data register 85 retains the data stored therein. The output data register 85 is externally accessible through a signal line 92. When requested, the output data register 85 externally outputs the data stored therein.

The expected data generator 86 develops expected data for each test address. The expected data developed is provided for the comparator 87.

The comparator 87 compares the output data received from the RAM 82 with the expected data received from the expected data generator 86 to develop the data update enable signal 88. When the output data received from the RAM 82 matches the expected data received from the expected data generator 86, the comparator 87 disenables the data update enable signal 88. When the output data received from the RAM 82 does not match the associated expected data, the comparator 87 enables the data update enable signal 88.

The fault diagnosis method in this embodiment, involving testing the RAM 82 using the fault diagnosis circuit 81, is composed of a test data write step, a first test step, and one or more subsequent test steps following the first test step.

The test data write step involves writing test data onto the RAM 82. In this embodiment, data of "0" is written each even-numbered address of the RAM 82, and data of "F" (or data of "15" in the decimal notation) is written to each odd-numbered address.

The test data write step is followed by the first test step. The first test step begins with initializing the error address register 84, setting the address #8 into the error address register 84. The first test is then performed from a start address, continuously supplying the clock signal to the fault diagnosis circuit 81 and the RAM 82 over clock cycles sufficient to test all of the addresses of the RAM 82. When there are one or more errors in the RAM 82, this results in that the error address register 84 is set to the highest error address which has ever been found, since the error address register 84 is updated in response to the data update enable signal 88, only when the output data received from the RAM 82 does not match the associated expected data. After the first test, the output data register 85 contains the output data associated with the highest error address, since the output data register 85 latches the output data from the RAM 82 only when the output data received from the RAM 82 does not match the associated expected data. The highest error address stored in the error address register 84 and the associated output data stored in the output data register 85 are externally outputted through the signal lines 91 and 92.

One or more subsequent tests are performed after the first test when any error is found during the first test. The second test begins with calculating the number of clock cycles required for testing the RAM 82 from the start address (that is, the address #0) to the address just previous to the highest error address, detected by the first test. When an error is found at the addresses #2 and #4 during the first test, for example, the number of clock cycles required for testing the RAM 82 from the addresses #0 to #3 is calculated. This is followed by supplying the clock signal over the calculated number of clock cycles. This results in that the error address register 84 is set to the second highest error address, and the output data register 85 is set to the output data associated with the second highest error address. The error address stored in the error address register 84 and the output data associated therewith are externally outputted through the signal lines 91 and 92. The thus-described test is repeated until no additional error is found during the test. This procedure effectively achieves obtaining all the error addresses within the RAM 82 and the output data associated therewith.

One advantage of the fault diagnosis method in this embodiment over the previous embodiments is that the fault diagnosis method in this embodiment eliminates the need for providing the fault diagnosis start address register or the fault diagnosis end address register, which are used to activate the comparator. This effectively reduces the circuitry overhead.

It is apparent that the present invention is not limited to the above-described embodiments, which may be modified and changed without departing from the scope of the invention.

What is claimed is:

1. A fault diagnosis method for a semiconductor device in which a memory and a register are monolithically integrated in a semiconductor chip, said fault diagnosis method comprising:
   first testing said memory with respect to a series of addresses to identify a first error address;
   externally outputting said first error address;
   storing said first error address into said register;
   second testing said memory from a beginning of the series of addresses;
   identifying a second error address different from said first error address using a result of said second testing and said first error address stored in said register;
   externally outputting said second error address; and
   updating said register to store said second error address.

2. The fault diagnosis method according to claim 1, wherein said second testing involves successively testing said memory to a certain address higher than said first error address, and
   wherein an error address which is firstly found by the said second testing in an address range higher than said first error address is identified as said second error address.

3. The fault diagnosis method according to claim 2, wherein said second testing includes:
   providing a test address for each clock cycle;
   obtaining output data from said test address of said memory; and
   comparing said output data with an expected value associated with said test address, and
   wherein said identifying said second error address includes:
   enabling a diagnosis enable signal in response to said test address being higher than said first error address;
   disenabling said diagnosis enable signal in response to said test address being equal to or lower than said first error address;
   identifying said test address as being said second error address when said output data is different from said expected value with said diagnosis enable signal enabled.

4. The fault diagnosis method according to claim 2, wherein said second testing stops when said firstly-found error address is found in said address range.

5. The fault diagnosis method according to claim 3, wherein said semiconductor chip comprises an integrated output data register, and
   said fault diagnosis method further comprising:
   updating said output data register to store said output data, each when said output data is obtained from said memory; and
   externally outputting said output data from said output data register after said second testing is completed.

6. The fault diagnosis method according to claim 1, wherein said first testing involves successively testing said memory from a start address to an end address, and an error address, which is finally found by said first testing, is identified as being said first error address,
   wherein said second testing involves successively testing said memory from said start address to a just previous address of said first error address or to a certain address lower than said first error address, and wherein an error address which is finally found by said second testing in an address range from said start address to said just previous address of said first error address is identified as said second error address.

7. The fault diagnosis method according to claim 6, wherein said second testing includes:
providing a test address for each clock cycle;
obtaining output data from said test address of said memory; and
comparing said output data with an expected value associated with said test address,
wherein said identifying said second address includes:
enabling a diagnosis enable signal in response to said test address being lower than said first error address;
disenabling said diagnosis enable signal in response to said test address being equal to or higher than said first error address; and
updating said register to store said test address when said output data is different from said expected value with said diagnosis enable signal enabled, and
wherein an error address stored in said register when said second testing is completed is identified as said second error address.

8. The fault diagnosis method according to claim 6, wherein, each when an error address is found during said second testing, said register is updated to store said found error address.

9. The fault diagnosis method according to claim 6, wherein said semiconductor chip comprises an integrated output data register,
wherein said second testing includes:
providing a test address for each clock cycle;
obtaining output data from said test address of said memory; and
comparing said output data with an expected value associated with said test address,
said fault diagnosis method further comprising:
updating said output data register to store said output data each when said output data is obtained from said memory; and
externally outputting said output data from said output data register after said second testing is completed.

10. The fault diagnosis method according to claim 1, further comprising:
third testing said memory with respect to said series of addresses;
identifying a third error address different from said first and second error addresses using a result of said third testing and said second error address stored in said register;
externally outputting said third error address; and
updating said register to store said third error address.

11. The fault diagnosis method according to claim 1, wherein the first testing comprises updating of the test address synchronous with a clock signal.

12. The fault diagnosis method according to claim 11, further comprising increasing the test address for each clock cycle.

13. A semiconductor device, comprising:
a memory;
an address generator generating and updating an address so that said address is successively increased from a certain start address;
a fault diagnosis start address register comprising a fault diagnosis start address so that said fault diagnosis start address is externally accessible;
a fault diagnosis enable generator comparing said address with said fault diagnosis start address; and a comparator comparing output data obtained from said address of said memory with an expected value associated with said address,
wherein said address generator stops updating said address when said output data does not match said expected value and said address is higher than said fault diagnosis start address;
wherein said fault diagnosis start address register receives a stop address at which the update of said address is stopped, and to update said fault diagnosis start address to said stop address, and
wherein said address is returned to said certain start address after said fault diagnosis start address is updated.

14. The semiconductor device according to claim 13, further comprising:
an address holding register to receive said address from said address generator, each when said address is updated, and to contain said received address,
wherein said address holding register provides said address contained therein as said stop address for said fault diagnosis start address register after said update of said address is stopped.

15. The semiconductor device according to claim 14, further comprising:
an output data register to hold said output data received from said memory so that said output data is externally accessible,
wherein said output data register is updated to store said output data each when said output data is outputted from said memory.

16. The semiconductor device according to claim 13, wherein the comparator compares data in a second test from a beginning of a series of addresses.

17. A semiconductor device, comprising:
a memory;
an address generator generating and updating an address to successively increase said address from a certain start address;
a fault diagnosis end address register comprising a fault diagnosis end address so that said fault diagnosis end address is externally accessible;
an address holding register designed to receive said address from said address generator;
a fault diagnosis enable generator comparing said address with said fault diagnosis end address; and
a comparator comparing output data obtained from said address of said memory with an expected value associated with said address,
wherein said address holding register is updated to store said address received from said address generator when said address is lower than said fault diagnosis end address, and said output data does not match said expected data,
wherein said fault diagnosis end address contained in said fault diagnosis end address register is updated to said address contained in said address holding register after said address reaches a just previous address of said fault diagnosis end address.

18. The semiconductor device according to claim 17, further comprising:
an output data register designed to hold said output data received from said memory so that said output data is externally accessible,
wherein said output data register is updated to store said output data each when said output data is outputted from said memory.

19. A semiconductor device, comprising:

a memory;

an address generator generating and updating an address so that said address is successively increased from a certain start address;

an error address holding register designed to receive said address from said address generator; and a comparator comparing output data obtained from said address of said memory with an expected value associated with said address, wherein said error address holding register is updated to store said address received from said address generator when said output data does not match said expected data, wherein second testing of said memory begins from the certain start address, and wherein said error address holding register is externally accessible.

20. The semiconductor device according to claim 19, wherein the address generator increases the address for each clock cycle of an associated clock.

* * * * *